(12) United States Patent
Geng et al.

(10) Patent No.: US 9,727,415 B2
(45) Date of Patent: Aug. 8, 2017

(54) CONFIGURATION STRUCTURE AND METHOD OF A BLOCK MEMORY

(71) Applicant: CAPITAL MICROELECTRONICS CO., LTD., Beijing (CN)

(72) Inventors: Jia Geng, Beijing (CN); Yuanpeng Wang, Beijing (CN); Ping Fan, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/772,455

(22) PCT Filed: Nov. 27, 2014

(86) PCT No.: PCT/CN2014/092342
§ 371 (c)(1),
(2) Date: Sep. 3, 2015

(87) PCT Pub. No.: WO2016/082141
PCT Pub. Date: Jun. 2, 2016

(65) Prior Publication Data
US 2016/0364290 A1    Dec. 15, 2016

(51) Int. Cl.
*H03M 13/00* (2006.01)
*G06F 11/10* (2006.01)
(Continued)

(52) U.S. Cl.
CPC ........ *G06F 11/1068* (2013.01); *G06F 3/0604* (2013.01); *G06F 3/064* (2013.01); *G06F 3/0619* (2013.01); *G06F 3/0629* (2013.01); *G06F 3/0679* (2013.01); *G06F 5/10* (2013.01); *G06F 11/1028* (2013.01); *G06F 11/1048* (2013.01); *G11C 7/10* (2013.01); *G11C 29/52* (2013.01); *H03M 13/05* (2013.01); *H03M 13/2906* (2013.01); *G11C 7/1075* (2013.01); *G11C 2029/0411* (2013.01); *H03M 13/19* (2013.01)

(58) Field of Classification Search
CPC .... G06F 11/1068; G06F 3/0619; G06F 3/064; G06F 3/0679; G04F 3/0604; G11C 7/10
See application file for complete search history.

(56) References Cited

U.S. PATENT DOCUMENTS

| | | | |
|---|---|---|---|
| 6,690,595 B1 * | 2/2004 | Srinivasan | G11C 15/00 365/189.07 |
| 6,914,795 B1 * | 7/2005 | Srinivasan | G11C 15/00 365/189.07 |

(Continued)

*Primary Examiner* — Esaw Abraham
(74) *Attorney, Agent, or Firm* — Buchanan Ingersoll & Rooney PC

(57) ABSTRACT

A configuration structure and method of a block memory. The configuration structure includes a first port, a second port, an ECC module, and an FIFO module; the ECC module includes an ECC encoder and an ECC decoder; the FIFO module is used for setting the first clock enable terminal and the second clock enable terminal, so as to make the read clock synchronous or asynchronous with and the write clock of the block memory. The read width and the write width of the block memory can be independently configured, and the block memory has built-in an ECC function and a FIFO function, and can be cascaded to a block memory with larger storage space without consuming additional logic resource.

16 Claims, 13 Drawing Sheets

(51) Int. Cl.
*G11C 7/10* (2006.01)
*G06F 3/06* (2006.01)
*G11C 29/52* (2006.01)
*H03M 13/29* (2006.01)
*G06F 5/10* (2006.01)
*H03M 13/05* (2006.01)
*H03M 13/19* (2006.01)
*G11C 29/04* (2006.01)

(56) References Cited

U.S. PATENT DOCUMENTS

| | | | | |
|---|---|---|---|---|
| 7,196,708 B2 * | 3/2007 | Dorojevets | ......... | G06F 9/30014 345/502 |
| 7,242,633 B1 * | 7/2007 | Ching | ................. | G11C 7/1075 365/189.04 |
| 7,248,491 B1 * | 7/2007 | Ching | ................. | G11C 7/1075 365/230.05 |
| 7,283,380 B1 * | 10/2007 | Srinivasan | ............. | G11C 15/04 365/189.07 |
| 8,104,000 B2 * | 1/2012 | Bjesse | ................. | G06F 17/504 716/106 |

* cited by examiner

CONFIGURATION STRUCTURE AND METHOD OF A BLOCK MEMORY

BACKGROUND

Technical Field

The present invention relates to the field of memory configuration, and in particular, to a configuration structure and method of a block memory based on Field Programmable Gate Array (referred as FPGA).

Related Art

In the prior art, a block memory cannot have its read width and write width configured independently, has a limited width, and has not provided with functions of error checking and correcting and FIFO. If the block memory is to be expanded, additional logic resources have to be consumed, resulting in a restricted use of the block memory.

SUMMARY

An objective of the present invention is to solve the problems that read width and write width of a block memory cannot be configured independently, and the block memory has limited width, and has no functions of error checking and correcting, and FIFO, in the prior art.

According to a first aspect, an embodiment of the present invention provides a configuration structure of a block memory, where the configuration structure comprises: a first port, a second port, an ECC module, and an FIFO module; the first port includes a first clock terminal, a first clock enable terminal, a first write enable terminal, a first data input terminal, and a first address input terminal; the read width and the write width of the first port have different values, and the read width of the first port is equal to the write width of the first port multiplied by the Nth power of two; when the number of the read address of the first port is different from that of the write address of the first port, the number of address lines of the first address input terminal meets the bigger one of the number of read address of the first port and the number of write address of the first port; the second port includes a second clock terminal, a second clock enable terminal, a second write enable terminal, a second data input terminal, and a second address input terminal; the read width and the write width of the second port have different values, and the read width of the second port is equal to the write width of the second port multiplied by the Nth power of two; when the number of the read address of the second port is different from that of the write address of the second port, the number of address lines of the second address input terminal meets the bigger one of the number of read address of the second port and the number of write address of the second port, wherein N is an integer; the read width of the first port and the read width of the second port have different values, and the write width of the first port and the write width of the second port have different values; when a first data is written into the first data input terminal, according to the bits of the first data, the control signal of the first write enable terminal controls the first data to be written into the block memory bit-wisely; when a second data is written into the second data input terminal, according to the bits of the second data, the control signal of the second write enable terminal controls the second data to be written into the block memory bit-wisely; the ECC module includes an ECC encoder and an ECC decoder, when the first data is written into the first data input terminal, the ECC encoder generates a check bit for the first data, which check bit is written into the block register via a first parity data input terminal of the first port; when reading the first data, the ECC decoder gets the first data and the check bit from the block memory, and generates a single bit error and a double bit error; the FIFO module is used for setting the first clock enable terminal and the second clock enable terminal, so as to make the read clock of the block memory synchronous or asynchronous with and the write clock of the block memory;

Preferably, the ECC encoder includes an encoder control bit for opening or closing the ECC encoder; the ECC decoder includes a decoder control bit for opening or closing the ECC decoder.

Preferably, two blocks of 18K block memory can be cascaded as a block of 32 k×1 block memory.

Preferably, the block memory includes an SP usage mode, an SDP usage mode, and a TDP usage mode.

Further preferably, when the block memory has a size of 18K, the maximum data width of the SP usage mode is 72 bit, and the maximum data width of the SDP usage mode is 72 bit, and the maximum data width of the TDP usage mode is 36 bit.

Preferably, the block memory includes a write_first write mode, a read_first write mode, and a no_change write mode. Further preferably, when the first port reads and writes the first address at the same time, or the second port reads and writes the first address at the same time; if in the write_first write mode, a new data will be written into the first address of the block memory by the first port, and at the same time the new data of the first address will be read by the first port; or a new data will be written into the first address of the block memory by the second port, and at the same time the new data of the first address will be read by the second port; if in the read_first write mode, an original data stored by the first address of the block memory will be read by the first port, and a new data will be written into the first address of the block memory by the first port; or an original data stored by the first address of the block memory will be read by the second port, and a new data will be written into the first address of the block memory by the second port; if in the no_change write mode, a new data will be written into the first address by the first port, and the output of the first port remains unchanged; or a new data will be written into the first address by the second port, and the output of the second port remains unchanged.

Further preferably, when the first port reads the first address and the second port writes the first address, or when the first port writes the first address and the second port reads the first address, if in the read_first write mode, a new data will be written into the first address by the first port, and a previous data stored by the first address will be read by the second port; or a new data will be written into the first address by the second port, and a previous data stored by the first address will be read by the first port; if in the write_first write mode or the no_change write mode, a new data will be written into the first address by the first port, and a read data of the second port will be an invalid data; or, a new data will be written into the first address by the second port, and a read data of the first port will be an invalid data.

Preferably, the FIFO module includes an overflow output identification, an underflow output identification, an almost empty output identification, and an almost full output identification, wherein the offset between the almost full output and the Overflow output, and the offset between the almost empty output and the underflow output are configured by parameters of the FIFO module.

According to another aspect, an embodiment of the present invention provides a configuration method of a block memory, wherein the method comprises: the read width and the write width of the first port have different values, and the read width of the first port is equal to the write width of the first port multiplied by the Nth power of two; when the number of the read address of the first port is different from that of the write address of the first port, the number of address lines of the first address input terminal meets the bigger one of the number of read address of the first port and the number of write address of the first port; the read width and the write width of the second port have different values, and the read width of the second port is equal to the write width of the second port multiplied by the Nth power of two; when the number of the read address of the second port is different from that of the write address of the second port, the number of address lines of the second address input terminal meets the bigger one of the number of read address of the second port and the number of write address of the second port, wherein N is an integer; the read width of the first port and the read width of the second port have different values, and the write width of the first port and the write width of the second port have different values; when a first data is written into the first data input terminal, according to the bits of the first data, the control signal of the first write enable terminal controls the first data to be written into the block memory bit-wisely.

Preferably, when a second data is written into the second data input terminal, according to the bits of the second data, the control signal of the second write enable terminal controls the second data to be written into the block memory bit-wisely.

Preferably, the ECC module includes an ECC encoder and an ECC decoder, when the first data is written into the first data input terminal, the ECC encoder generates a check bit of the first data, and the check bit is written into the block register by a first parity data input terminal of the first port; when reading the first data, the ECC decoder gets the first data and the check bit from the block memory, and generates a single bit error and a double bit error; the FIFO module sets the first clock enable terminal and the second clock enable terminal, so as to make the read clock of the block memory synchronous or asynchronous with the write clock of the block memory.

Preferably, the method comprises: the ECC encoder includes an encoder control bit, and a decoder control bit; the encoder control bit opens or closes the ECC encoder; the decoder control bit opens or closes the ECC decoder.

Preferably, the method comprises: when the block memory has a size of 18K, the maximum data width of the SP usage mode is 72 bit, and the maximum data width of the SDP usage mode is 72 bit, and the maximum data width of the TDP usage mode is 36 bit.

Preferably, the block memory includes a write_first write mode, a read_first write mode, and a no_change write mode.

Further preferably, when the first port reads and writes the first address at the same time, the second port reads and writes the first address at the same time; if in the write_first write mode, a new data will be written into the first address of the block memory by the first port, and at the same time the new data of the first address will be read by the first port; or a new data will be written into the first address of the block memory by the second port, and at the same time the new data of the first address will be read by the second port; if in the read_first write mode, an original data stored by the first address of the block memory will be read by the first port, and a new data will be written into the first address of the block memory by the first port; or an original data stored by the first address of the block memory will be read by the second port, and a new data will be written into the first address of the block memory by the second port; if in the no_change write mode, a new data will be written into the first address by the first port, and the output of the first port remains unchanged; or a new data will be written into the first address by the second port, and the output of the second port remains unchanged.

Further preferably, when the first port reads the first address and the second port writes the first address, or when the first port writes the first address and the second port reads the first address, if in the read_first write mode, a new data will be written into the first address by the first port, and a previous data stored by the first address will be read by the second port; or a new data will be written into the first address by the second port, and a previous data stored by the first address will be read by the first port; if in the write_first write mode or the no_change write mode, a new data will be written into the first address by the first port, and a read data of the second port will be an invalid data; or, a new data will be written into the first address by the second port, and a read data of the first port will be an invalid data.

Preferably, the FIFO module includes an overflow output identification, an underflow output identification, an almost empty output identification, an almost full output identification, wherein the offset between the almost full output and the overflow output, and the offset between the almost empty output and the underflow output are configured by parameters of the FIFO module.

The configuration structure of the block memory according to an embodiment of the present invention allows the read width and the write width of the block memory to be independently configured; and since the block memory has a built-in ECC function and an FIFO function, the block memory can be cascaded to a block memory with larger storage space without consuming additional logic resources.

DETAILED DESCRIPTION

To make the objectives, technical solutions and advantages of the present invention more clear, the technical solutions in the present invention are described below clearly and completely with reference to the accompanying drawings in the embodiments of the present invention. Obviously, the described embodiments are merely some but not all of the embodiments of the present invention. All other embodiments obtained by a person of ordinary skill in the art based on the embodiments of the present invention without creative efforts shall fall within the protection scope of the present invention.

In order to make the present invention easier to understand, the specific embodiments are further explained below with reference to the accompanying drawings, and the embodiments do not constitute the restrictions of the embodiments of the present invention.

A configuration structure and a configuration method of a block memory according to the present invention are applicable to block memory in logic device; wherein by configuring the block memory, the read width and write width of the first port of the block memory can be configured independently, and the read width and write width of the second port of the block memory configured independently; the block memory has functions of error checking and correcting, and First In First Out; the block memory can be cascaded to extend storage space, for example two blocks of 9 k block memory can be extended as a block of 18 k block memory, two 18 k block memory can be extended as a 32 k block memory.

The logic device may be application-specific integrated circuit (ASIC) or programmable logic device (PLD). The PLD may be complex programmable logic device (CPLD), or FPGA, or generic array logic (GAL), or their combination.

The first port below is port A, the second port below is port B.

Figure 1:
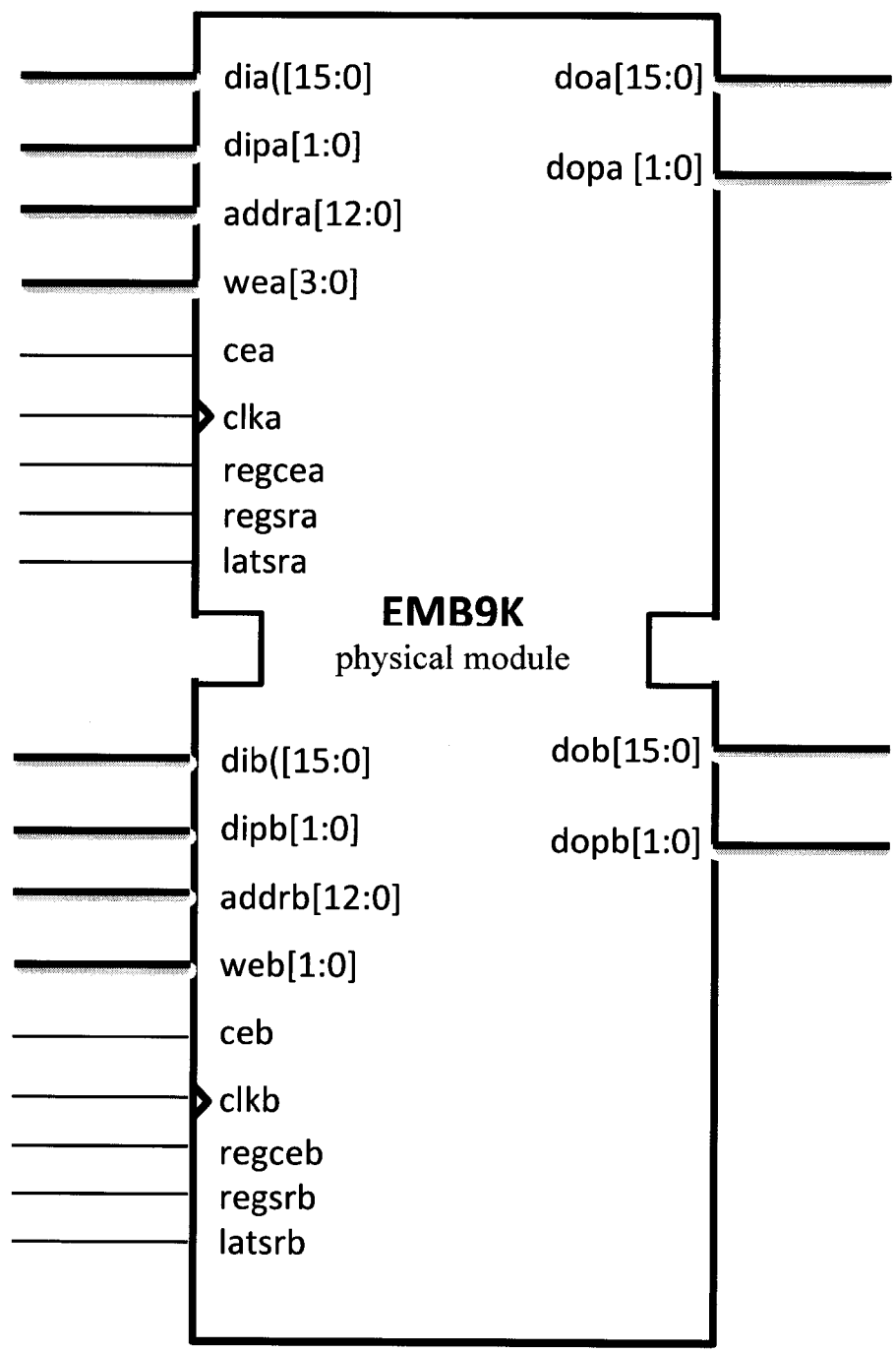
FIG. 1 is a usage mode of 9K block memory according to an embodiment of the present invention.

FIG. 1 is a usage mode of 9K block memory according to an embodiment of the present invention. As shown in FIG. 1, the capacity of the block memory (i.e., expanded memory block, EMB) in the this embodiment is 9K, where the block memory comprises a first port and a second port, the first port is at the top of the block memory, the second port is at the bottom of the block memory; the first port includes a first clock terminal (clka), a first clock enable terminal (cea), a first write enable terminal (wea[3:0]), a first data input terminal (dia[15:0]), a first parity-check data input terminal (dipa[1:0]), a first address (addra[14:0]), a first data output terminal (doa[15:0]), a first parity-check data output terminal (dopa[1:0]); the second port includes a second clock terminal (clkb), a second clock enable terminal (ceb), a second write enable terminal (web[3:0]), a second address (addrb[14:0]), a second data input terminal (dib[15:0]), a second parity-check data input terminal (dipb[1:0]), a second data output terminal (dob[15:0]), a second parity-check data output terminal (dopb[1:0]).

Wherein, the read width of the first port and the write width of the first port can be configured to have different values, and the read width of the first port is the write width of the first port multiplied by the Nth power of two; when the number of the read address of the first port is different from that of the write address of the first port, the number of address lines of the first address input terminal meets the bigger one of the number of read address of the first port and the number of write address of the first port.

The read width of the second port and the write width of the second port can be configured to have different values, and the read width of the second port is the write width of the second port multiplied by the Nth power of two; when the number of the read address of the second port is different from that of the write address of the second port, the number of address lines of the second address input terminal meets the bigger one of the number of read address of the second port and the number of write address of the second port.

The read width of the first port and the read width of the second port can be configured to be different values, and the write width of the first port and the write width of the second port can be configured to be different values.

When a first data is written into the first data input terminal, according to the bits of the first data, the control signal of the first write enable terminal controls the first data to be written into the block memory bit-wisely.

When a second data is written into the second data input terminal, according to the bits of the second data, the control signal of the second write enable terminal controls the second data to be written into the block memory bit-wisely.

Specifically, the write width at the time of the first data input terminal (dia[15:0]) of the first port writing data and the read width at the time of the first data output terminal (doa[15:0]) of the first port reading data can be configured to be different values; when the write width at the time of the first data input terminal (dia[15:0]) of the first port writing data and the read width at the time of the first data output terminal (doa[15:0]) of the first port reading data have different values, its width ratio is set to the Nth power of two, N is an integer.

When the number of the write address of the first data input terminal (dia[15:0]) is different from that of the read address of the first data output terminal (dio[15:0]), for example, the first data output (doa[15:0]) of the first port is configured to 1024×9, wherein 1024 is the read address number, 9 is the read width; the first data input terminal (dia[15:0]) is configured to 512×18, wherein 512 is the write address number, 18 is the write width. At this point, the first address line addra [9:0] should have ten significant bits, in order to guarantee that 1024 addresses of the first data output doa [15:0] can be addressed.

The write width of the second data input terminal dib[15:0] of the second port and the write width of the first data input terminal dia[15:0] of the first port can be configured to have same values, and the read width of the second data output terminal dob[15:0] of the second port and the read width of the first data output terminal doa[15:0] of the first port can be configured to have different values; and the write width of the second data input terminal dib[15:0] of the second port and the read width of the second data output terminal dob[15:0] of the second port can be configured to have different values.

When the first data is written into the block register via the first port, the first write enable terminal wea[3:0] controls the first data to be written into the block memory bit-wisely. For example, when the first data has 16 bits, if the write port of the first data input terminal is configured to be 16-bit-wide, the first enable terminal may includes 2-bit write enable signals, wea[1] and wea[0], wherein wea[1] controls dia[15:8] to be written, wea[0] controls dia[7:0] to be written, so as to make the first data bit-wisely (i.e., 8 bits) written into the block memory.

When the first data has 16 bits, if the first data also includes a parity-check bit, the first write enable terminal may include two write enable signals, din[7:0] and din[15:8], and a parity-check bit is dinp[1:0], the first write enable terminal will make the first data (din[7:0]/dinp[0], din[15:8]/dinp[1]) bit-wisely written into the block memory.

The description of ports in FIG. 1 is shown in table 1:

TABLE 1

| port name | type | bit-wide | Description |
| --- | --- | --- | --- |
| dia[15:0] | Input | 16 | The data input terminal of Port A; in the sdp and the SP mode, corresponding to low 16-bit data input. |
| dipa[1:0] | Input | 2 | The parity-check bit data input terminal of Port A; in the sdp and the SP mode, corresponding to the parity-check bit input of low 16-bit data. |
| doa[15:0] | Output | 16 | The data output terminal of Port A; in the sdp and the SP mode, corresponding to low 16-bit data output. |
| dopa[1:0] | Output | 2 | The parity-check bit data output terminal of Port A; in the sdp and the SP mode, corresponding to the parity-check bit data output of low 16-bit data |
| addra[12:0] | Input | 13 | The address input terminal of A port; in the sdp mode, corresponding to write address. |
| wea[3:0] | Input | 4 | The bit-wise write enable input terminal of Port A; in the sdp mode, corresponding to bit-wise write enable input terminal of write port. |
| cea | Input | 1 | The clock enable terminal of Port A; in the sdp mode corresponding to write clock enable terminal of write port. |
| clka | Input | 1 | The clock terminal of Port A; in the sdp mode, corresponding to write clock. |
| regcea | Input | 1 | The enable signal terminal of output register of Port A; in the sdp mode, the terminal is not used. |
| regsra | Input | 1 | The reset signal terminal of output register of Port A, the reset value of which is specified by attribute srval_a. In the sdp mode, the terminal is not used. |
| latsra | Input | 1 | The reset signal terminal of output latch of Port A, the reset value is specified by the attribute srval_a. In the sdp mode, the terminal is not used. |
| dib[15:0] | Input | 16 | The data input terminal of Port B; in the sdp and the SP mode, corresponding to high 16-bit data input. |
| dipb[1:0] | Input | 2 | The parity-check bit data input terminal of Port B; in the sdp and SP mode, corresponding to the parity-check bit data input of high 16-bit data. |
| dob[15:0] | Output | 16 | The data output terminal of Port B, in the sdp and the SP mode, corresponding to high 16-bit data output. |
| dopb[1:0] | Output | 2 | The parity-check bit data output terminal of Port B; in the sdp and the SP mode, corresponding to the parity-check bit data output of high 16-bit data. |
| addrb[12:0] | Input | 13 | The address input terminal of Port B; in the sdp mode, corresponding to read address. |
| web[1:0] | Input | 2 | The bit-wise write enable input terminal of Port B; in the sdp mode, the terminal is not used. |
| ceb | Input | 1 | The clock enable terminal of Port B; in the sdp mode, corresponding to read clock enable terminal. |
| clkb | Input | 1 | The clock terminal of Port B; in the sdp mode, corresponding to read clock. |
| regceb | Input | 1 | The enable signal terminal of output register of Port B; in the sdp mode, corresponding to enable signal terminal of output register. |
| regsrb | Input | 1 | The reset signal terminal of output register of Port B, the reset value of which is specified by the attribute srval_a; in the sdp mode, corresponding to reset signal terminal of output register. |
| latsrb | Input | 1 | The reset signal terminal of output latch of Port B, the reset value of which is specified by the attribute srval_a; in the sdp mode, corresponding to reset signal terminal of output latch. |

The available attribute of ports in FIG. 1 is shown in table 2.

TABLE 2

| attribute | type | value range | default | description |
| --- | --- | --- | --- | --- |
| init_00 to init_1f | Hex | 256 bit Hex | All 0's | The data initialization value of block memory |
| initp_00 to initp_03 | Hex | 256 bit Hex | All 0's | The parity-check bit sequence initialization value of block memory. |

TABLE 2-continued

| attribute | type | value range | default | description |
|---|---|---|---|---|
| init_file | String | String | None | The file name of initialization file. |
| rammode | String | "tdp", "sp", or "sdp" | "tdp" | The operation mode of block memory. |
| writemode_a | String | "write_first", "read_first", or "no_change" | "write_first" | The write mode of port A; in the sdp mode, corresponding to the write mode of write port. |
| writewidth_a | Decimal | 0, 1, 2, 4, 9, 18, 36 | 0 | The write data width of port A (includingtheparity-check bit width); in the sdp mode, corresponding to the data width of write port. |
| readwidth_a | Decimal | 0, 1, 2, 4, 9, 18 | 0 | The read data width of port A (includingthe parity-check bit width); in the sdp mode, not used. |
| outreg_a | Decimal | 0, 1 | 0 | Whether to use the output register of port A; not used in the sdp mode. |
| init_a | Hex | 18 bit Hex | 18h'00000 | Define the initial value of the output register and latch of port aafter power on; not used in the sdp mode. |
| srval_a | Hex | 18 bit Hex | 18h'00000 | Specify the reset value of port A after the reset; not used in the sdp mode. |
| writemode_b | String | "write_first", "read_first", or "no_change" | "write_first" | The write mode of port B; not used in the sdp mode. |
| writewidth_b | Decimal | 0, 1, 2, 4, 9, 18 | 0 | The write data width of port B (includingthe parity-check bitwidth); not used in the sdp mode. |
| readwidth_b | Decimal | 0, 1, 2, 4, 9, 18, 36 | 0 | The read data width of port B (includingthe parity-check bit width); not used in the sdp mode. |
| outreg_b | Decimal | 0, 1 | 0 | Whetherto usethe output register of port B. |
| init_b | Hex | 18 bit Hex | 18h'00000 | Define the initial value for the output register and latch of port B after power on; not used in the sdp mode. |
| srval_b | Hex | 18 bit Hex | 18h'00000 | Specify the reset value of port B after the reset. |

FIGS. 2a to 2d are the configuration diagrams of TDP usage mode of 9K block memory in FIG. 1. As shown in FIG. 2, the block of memory can have three kinds of usage modes, an SP (single port) usage mode, an SDP (simple dual port) usage mode, and a TDP (true dual port) usage mode.

Figure 2A:
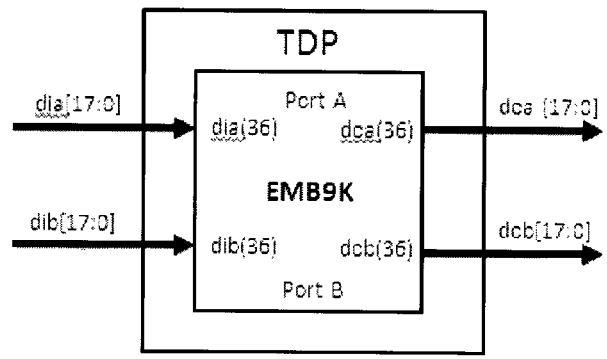
FIG. 2a is a configuration diagram of TDP usage mode of 9K block memory in FIG. 1.

In the TDP mode, the first port and the second port can read and write respectively, as shown in FIG. 2a.

Figure 2B:
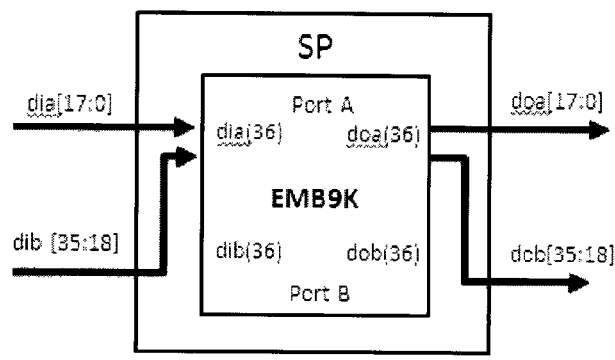
FIG. 2b is a first configuration diagram of SP usage mode of 9K block memory in FIG. 1.
Figure 2C:
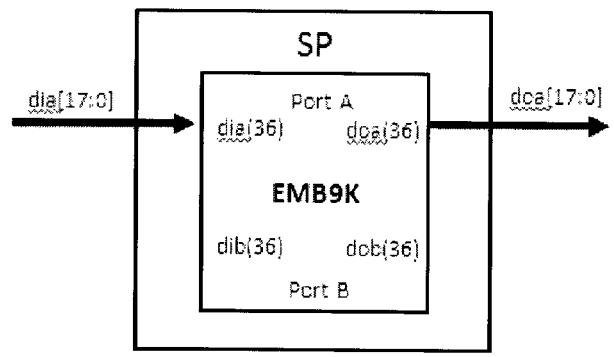
FIG. 2c is a second configuration diagram of SP usage mode of 9K block memory in FIG. 1.

In the SP mode, there is only one port to read and write, as shown in FIGS. 2b and 2c.

Figure 2D:
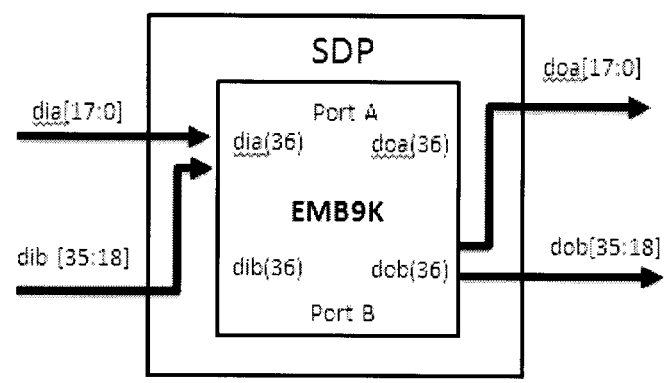
FIG. 2d is a configuration diagram of SDP usage mode of 9K block memory in FIG. 1.

In the SDP mode, one port controls write operations, the other port controls read operation, as shown in FIG. 2d.

When the address number and the read and write width are different, 9 k block memory can use different modes. Table 3 is a configuration table of 9 k memory in case of different address numbers, and different read and write widths. Table 3 includes the SDP usage mode and TDP usage mode.

In the table 3, "-" means unavailable, "√" means available. 256*36 means that the address number is 256 and the data line is 36, i.e., the read and write widths are 36 bit.

TABLE 3

| Port B | Port B | | | | | | | | | | | |
|---|---|---|---|---|---|---|---|---|---|---|---|---|
| Port B | 256 × 36 | | 512 × 18 | | 1k × 9 | | 2k × 4 | | 4k × 2 | | 8k × 1 | |
| MT Port A | TDP | SDP | TDP | SDP | TDP | SDP | TDP | SDP | TDP | SDP | TDP | SDP |
| 256 × 36 | — | √ | — | √ | — | √ | — | √ | — | √ | — | √ |
| 512 × 18 | — | √ | √ | √ | √ | √ | √ | √ | √ | √ | √ | √ |
| 1k × 9 | — | √ | √ | √ | √ | √ | √ | √ | √ | √ | √ | √ |
| 2k × 4 | — | √ | √ | √ | √ | √ | √ | √ | √ | √ | √ | √ |
| 4k × 2 | — | √ | √ | √ | √ | √ | √ | √ | √ | √ | √ | √ |
| 8k × 1 | — | √ | √ | √ | √ | √ | √ | √ | √ | √ | √ | √ |

Table 4 is a configuration table of 9 k memory in the SP usage mode, when the address number and the read and write width are different.

TABLE 4

| SP Mode | 256 × 36 | 512 × 18 | 1k × 9 | 2k × 4 | 4k × 2 | 8k × 1 |
|---|---|---|---|---|---|---|
| EMB 9Kb | √ | √ | √ | √ | √ | √ |

It can be seen from table 3 and table 4, when the address number and the read and write width of 9 k memory are different, the block of memory can have different modes.

When the block memory is 9 k, and in the TDP/SP mode, the port's data is shown in table 5:

TABLE 5

| Width | dia→doa<br>dib→dob | dipa→dopa<br>dipb→dopb | Depth | addra<br>addrb |
|---|---|---|---|---|
| 1 | [0] | — | 8K | [12:0] |
| 2 | [1:0] | — | 4K | [12:1] |
| 4 | [3:0] | — | 2K | [12:2] |
| 9 | [7:0] | [0] | 1K | [12:3] |
| 18 | di[15:0] = dia[15:0]<br>do[15:0] = doa[15:0] | dip[1:0] = dipa[1:0]<br>dop[1:0] = dopa[1:0] | 512 | [12:4] |
| 36<br>(SP<br>only) | di[31:0] =<br>dib[31:16],<br>dia[15:0]<br>do[31:0] =<br>dob[31:16],<br>doa[15:0] | dip[3:0] =<br>dipb[3:2],<br>dipa[1:0]<br>dop[3:0] =<br>dopb[3:2],<br>dopa[1:0] | 256 | [12:5] |

When the block memory is 9 k, and in the SDP mode, the port's data is shown in table 6:

TABLE 6

| Width | dia/–<br>–/dob | dipa/–<br>–/dopb | Depth | addra<br>addrb |
|---|---|---|---|---|
| 1 | [0] | — | 8K | [12:0] |
| 2 | [1:0] | — | 4K | [12:1] |
| 4 | [3:0] | — | 2K | [12:2] |
| 9 | [7:0] | [0] | 1K | [12:3] |
| 18 | di[15:0] = dia[15:0]<br>do[15:0] = dob[15:0] | dip[1:0] = dipa[1:0]<br>dop[1:0] = dopb[1:0] | 512 | [12:4] |
| 36 | di[31:0] =<br>dib[31:16],<br>dia[15:0]<br>do[31:0] =<br>dob[31:16],<br>doa[15:0] | dip[3:0] =<br>dipb[3:2],<br>dipa[1:0]<br>dop[3:0] =<br>dopb[3:2],<br>dopa[1:0] | 256 | [12:5] |

Figure 3:
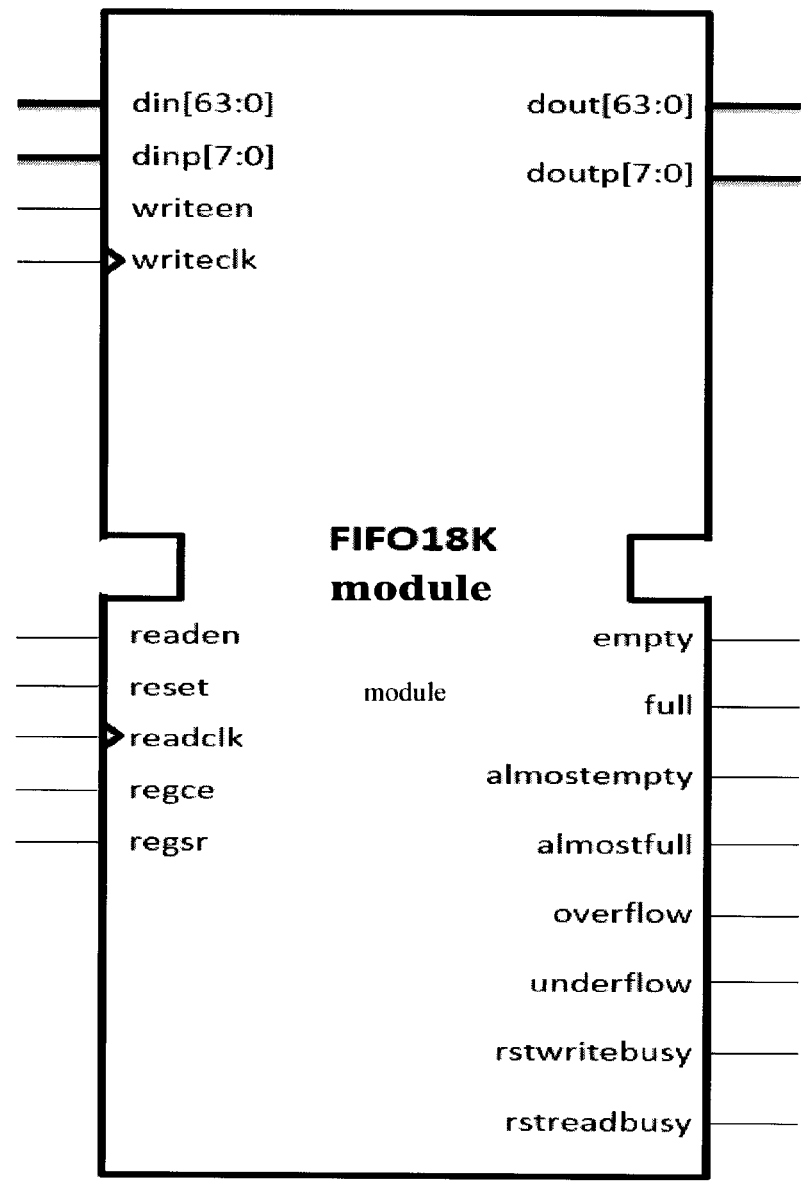
FIG. 3 is a usage mode of 18K block memory according to an embodiment of the present invention.

FIG. 3 is a usage mode of 18K block memory according to an embodiment of the present invention, wherein the EMB of 18K block memory can be achieved by cascading two block memory in FIG. 1. The 18K block memory includes a first port and a second port, the first port at the top of the block memory, the second port at the bottom of the block memory; the first port includes a first clock terminal (clka), a first clock enable terminal (cea), a first write enable terminal (wea[7:0]), a first address (addra[14:0]), a first data input terminal (dia[31:0]), a first parity-check data input terminal (dipa[3:0]), a first data output terminal (doa[31:0]), a first parity-check data output terminal (dopa[3:0]).

The second port includes a second clock terminal (clkb), a second clock enable terminal (ceb), a second write enable terminal (wea[7:0]), a second address (addrb[14:0]), a second data input terminal (dib[31:0]), a second parity-check data input terminal (dipb[3:0]), a second data output terminal (dob[31:0]), a second parity-check data output terminal (dopb[3:0]).

Wherein, the read width of the first port and the write width of the first port can be configured to have different values, and the read width of the first port is the write width of the first port multiplied by the Nth power of two; when the number of the read address of the first port is different from that of the write address of the first port, the number of address lines of the first address input terminal meets the bigger one of the number of read address of the first port and the number of write address of the first port.

The read width of the second port and the write width of the second port can be configured to have different values, and the read width of the second port is the write width of the second port multiplied by the Nth power of two; when the number of the read address of the second port is different from that of the write address of the second port, the number of address lines of the second address input terminal meets the bigger one of the number of read address of the second port and the number of write address of the second port.

The read width of the first port and the read width of the second port can be configured to have different values, and the write width of the first port and the write width of the second port can be configured to have different values.

When a first data is written into the first data input terminal, according to the bits of the first data, the control signal of the first write enable terminal controls the first data to be written into the block memory bit-wisely.

When a second data is written into the second data input terminal, according to the bits of the second data, the control signal of the second write enable terminal controls the second data to be written into the block memory bit-wisely.

Specifically, the write width of the first data input terminal (dia[31:0]) of the first port, and the read width of the first data output terminal (doa[31:0]) of the first port, can be configured to have same values or different values. If the write width at the time the first data input terminal (dia[31:0]) of the first port writes data and the read width at the time the first data output terminal (doa[31:0]) of the first port reads data are different, their width ratio may be integer power of two. For example, when the read width at the time the first data output terminal (doa[31:0]) of the first port reads data is 9 bit-wide, the write width at the time the first data input terminal (dia[31:0]) of the first port writes data can be 9, 18, 36, 72 bit-wide.

When the number of the write address of the first data input terminal (dia[31:0]) is different from that of the read address of the first data output terminal (dio[31:0]), for example, the first data output (doa[31:0]) of the first port is configured as 1024×9, the first data input terminal (dia[31:0]) is configured as 512×18, the first address line addra [14:0] should have ten significant bits in order to make sure 1024 addresses of the first data output doa [31:0] can be addressed. Then, addr [9:0] may be used as a write port, that is the write address of the first data input terminal.

The write width of the second data input terminal dib[31:0] of the second port and the write width of the first data input terminal dia[31:0] of the first port can be configured to have same values or different values, and the read width of the second data output terminal dob[31:0] of the second port and the write width of the first data input terminal dia[31:0] of the first port can be configured to have same values or different values; when the number of the write address of the second data input terminal dib[31:0] of the second port is different from that of the read address of the second data output terminal dob[31:0] of the second port, the second address lines addrb[14:0] must meet the bigger one of the number of write address of the second data input terminal dib[31:0] and the number of read address of the second data output terminal dob[31:0] of the second port.

When the first data is written into the block register via the first port, the first write enable terminal wea[3:0] controls the first data to be written into the block memory bit-wisely. For example, when the first data is 32 bit, if the first data input terminal dib[31:0] is configured to be 9 bit-wide, the first enable terminal includes 4 bit write enable signals, din[7:0], din[15:8], din[23:16], and din[31:24], so as to make the first data to be written into the block memory bit-wisely (i.e., 8 bit).

When the first data is 16 bit, if the first data also includes a parity-check bit, for example the first write enable terminal includes two write enable signals, din[7:0] and din[15:8], and the parity-check bit dinp[1:0], the first write enable terminal will make the first data (din[7:0]/dinp[0], din[15:8]/dinp[1]) be written into the block memory bit-wisely.

A cascade input terminal of the first port (casina), a cascade output terminal of the first port (casouta), a cascade input terminal of the second port (casinb), and a cascade output terminal of the second port (casoutb) are the cascade ports of the block memory, for extending the block memory. For example, two blocks of 18K block memory in FIG. 3 can be extended to a 32 k*1 block memory via the four interfaces.

The description of ports in FIG. 3 is shown in table 7:

TABLE 7

| port name | type | bit-wide | description |
|---|---|---|---|
| eccindberr | Input | 1 | Double bit error signal input, used only in ECC mode. |
| eccinsberr | Input | 1 | Single bit error signal input, used only in ECC mode. |
| eccoutdberr | Output | 1 | Double bit error signal output, used only in ECC mode. |
| eccoutsberr | Output | 1 | Single bit error signal output, used only in ECC mode. |
| eccparity[7:0] | Output | 8 | 8 bit check code generated by ECC encoder; used only in ECC mode. |
| eccreadaddr[7:0] | Output | 8 | ECC read address, synchronizing with the output data, used only in ECC mode. |
| dia[31:0] | Input | 32 | Data input terminal of port A; in the sdp and SP mode, corresponding to the input of low 32-bit data. |
| dipa[3:0] | Input | 4 | Parity-check bit data input terminal of Port A; in the sdp and SP mode, corresponding to the parity-check bit input of low 32-bit data. |
| doa[31:0] | Output | 32 | Data output terminal of port A; in the sdp and SP mode, corresponding to the output of low 32-bit data. |
| dopa[3:0] | Output | 4 | Parity-check bit data output terminal of Port A; in the sdp and sp mode, corresponding to the parity-check bit output of low 32-bit data. |
| addra[14:0] | Input | 15 | Address input terminal of port A; in the sdp mode, corresponding to write address. |
| wea[7:0] | Input | 8 | Bit-wise write enable input terminal of port A; in the sdp mode, corresponding to bit-wise write enable input terminal of write port. |
| casina | Input | 1 | Cascade input of port A |
| casouta | Output | 1 | Cascade output of port A |
| cea | Input | 1 | Clockenableterminal of port A; in the sdp mode, corresponding to write enable input terminal of write port |
| clka | Input | 1 | Clockterminal of port A; in the sdp mode, corresponding to write clock. |
| regcea | Input | 1 | The enable signal terminal of output register of Port A; in the sdp mode, the terminal is not used. |
| regsra | Input | 1 | The reset signal terminal of output register of Port A, the reset value of which is specified by the attribute srval_a. In the sdp mode, the terminal is not used. |
| latsra | Input | 1 | The reset signal terminal of output latch of Port A, the reset value of which is specified by the attribute srval_a. Theterminal is not used in the sdp mode. |
| dib[31:0] | Input | 32 | The data input terminal of Port B; in the sdp and the SP mode, corresponding to high 32-bit data input. |
| dipb[3:0] | Input | 4 | The parity-check bit data input terminal of Port B; in the sdp and SP mode, corresponding to the parity-check bit data input of high 32-bit data. |
| dob[31:0] | Output | 32 | The data output terminal of Port B; in the sdp and the SP mode, corresponding to the output of high 32-bit data. |
| dopb[3:0] | Output | 4 | The parity-check bit data output terminal of Port B; in the sdp and the SP mode, corresponding to the parity-check bit data output of high 32-bit data. |
| addrb[14:0] | Input | 15 | Address input terminal of port B; in the sdp mode, corresponding to read address. |
| web[3:0] | Input | 4 | Bit-wise write enable input terminal of port B; in the sdp mode, the terminal is not used. |
| casinb | Input | 1 | Cascade input of port B |
| casoutb | Output | 1 | Cascade output of port B |
| ceb | Input | 1 | Clock enable terminal of port B; in the sdp mode, corresponding to read enable terminal. |
| clkb | Input | 1 | Clock terminal of port B; in the sdp mode, corresponding to read clock. |
| regceb | Input | 1 | The enable signal terminal of output register of Port B, in the sdp mode, corresponding to enable signal terminal of output register. |
| regsrb | Input | 1 | Reset signal terminal of output register of Port B, the reset value of which is specified by the attribute srval_a; in the sdp mode, corresponding to reset signal terminal of output register. |
| latsrb | Input | 1 | Reset signal terminal of output latch of Port B, the reset value of which is specified by the attribute srval_a; in the sdp mode, corresponding to reset signal terminal of output latch. |

The available property of ports in FIG. 3 is shown in table 8.

TABLE 8

| attribute | type | value range | default | description |
| --- | --- | --- | --- | --- |
| eccreaden | Decimal | 0, 1 | 0 | Open ECC decoder circuit |
| eccwriteen | Decimal | 0, 1 | 0 | open ECC encoder circuit |
| init_00 to init_3f | Hex | 256 bit Hex | All zero's | Data initialization value of block memory |
| initp_00 to initp_07 | Hex | 256 bit Hex | All zero's | Parity-check bit sequence initialization value of block memory. |
| init_file | String | String | None | File name of initialization file. |
| rammode | String | "tdp", "sp", or "sdp" | "tdp" | operation mode of block memory. |
| outreg_a | Decimal | 0, 1 | 0 | Whether to use the output register of port A; not used in the sdp mode. |
| readwidth_a | Decimal | 0, 1, 2, 4, 9, 18, 36 | 0 | Read data width of port A (including the parity-check bit width); not used in the sdp mode. |
| init_a | Hex | 36 bit Hex | 36h'00000 | Define the initial value for the output register and latch of port after power on; not used in the sdp mode. |
| srval_a | Hex | 36 bit Hex | 36h'000000000 | Specify the reset value of port A after the reset, not used in the sdp mode. |
| writewidth_a | Decimal | 0, 1, 2, 4, 9, 18, 36, 72 | 0 | The write data width of port A (including the parity-check bit width); in the sdp mode, corresponding to the data width of write port. |
| writemode_a | String | "write_first", "read_first", or "no_change" | "write_first" | Write mode of port A; in the sdp mode, corresponding to the write mode of write port. |
| casmode_a | String | "upper", "lower", "none" | "none" | Cascade mode of port A. |
| outreg_b | Decimal | 0, 1 | 0 | Whether to use the output register of port B; in the sdp mode, not used. |
| readwidth_b | Decimal | 0, 1, 2, 4, 9, 18, 36, 72 | 0 | Read data width of port B (including the parity-check bit width); in the sdp mode, not used. |
| init_b | Hex | 36 bit Hex | 36h'00000 | Define the initial value for the output register and latch of B port after power on; in the sdp mode, not used. |
| srval_b | Hex | 36 bit Hex | 36h'000000000 | Specify the reset value of port B after the reset; in the sdp mode, not used. |
| writewidth_b | Decimal | 0, 1, 2, 4, 9, 18, 36 | 0 | The write data width of port B (including the parity-check bit width); in the sdp mode, corresponding to the data width of write port. |
| writemode_b | String | "write_first", "read_first", or "no_change" | "write_first" | Write mode of port B; in the sdp mode, corresponding to the write mode of write port. |
| casmode_b | String | "upper", "lower", "none" | "none" | Cascade mode of port B. |

FIGS. 4a to 4d are the configuration diagrams of TDP usage mode of 18K block memory in FIG. 3. As shown in FIG. 4, the block of memory can have three kinds of usage modes, an SP (single port) usage mode, an SDP (simple dual port) usage mode, and a TDP (true dual port) usage mode.

Figure 4A:
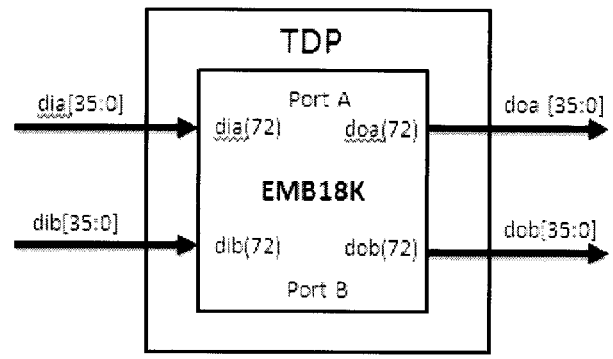
FIG. 4a is a configuration diagram of TDP usage mode of 18K block memory in FIG. 3.

In the TDP mode, the first port and the second port can read and write respectively, as shown in FIG. 4a.

Figure 4B:
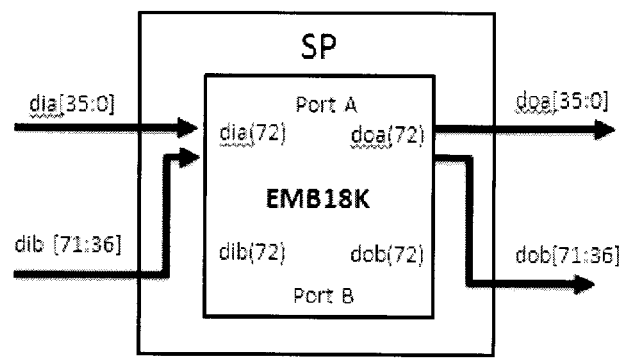
FIG. 4b is a first configuration diagram of SP usage mode of 18K block memory in FIG. 3.
Figure 4C:
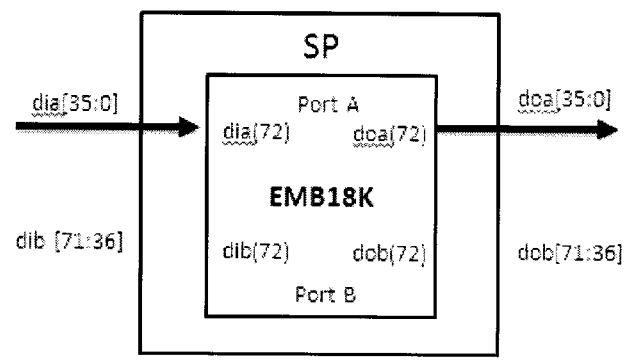
FIG. 4c is a second configuration diagram of SP usage mode of 18K block memory in FIG. 3.

In the SP mode, there is only one port to read and write, as shown in FIGS. 4b and 4c.

Figure 4D:
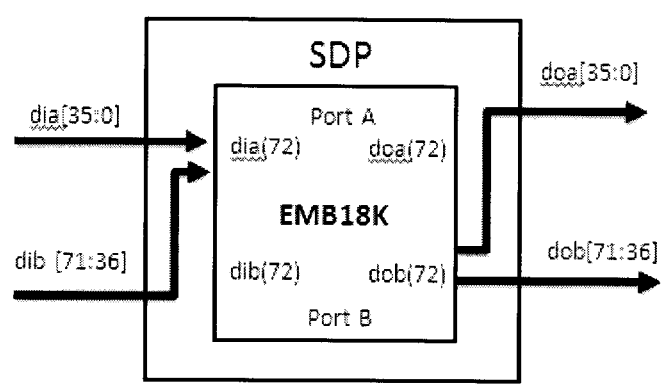
FIG. 4d is a configuration diagram of SDP usage mode of 18K block memory in FIG. 3.

In the SDP mode, one port controls the write operations, and the other port controls the read operation, as shown in FIG. 4d.

When the address number and the read and write width are different, 18 k block memory can use different modes. Table 9 is a usage mode table of a 18 k block memory in case that the address number is different from the read and write width. Table 9 includes the SDP usage mode and TDP usage mode.

In the table 9, the first port is port A, the second port is port B, "-" means unavailable, "√" means available. 256*72 means that the address number is 256 and the data line is 72, which means the read or write width is 72 bit.

TABLE 9

| | Port B | | | | | | | | | | | | | |
|---|---|---|---|---|---|---|---|---|---|---|---|---|---|---|
| | 256 × 72 | | 512 × 36 | | 1k × 18 | | 2k × 9 | | 4k × 4 | | 8k × 2 | | 16k × 1 | |
| MT | TDP | SDP | TDP | SDP | TDP | SDP | TDP | SDP | TDP | SDP | TDP | SDP | TDP | SDP |
| Port A | | | | | | | | | | | | | | |
| 256 × 72 | — | ✓ | — | ✓ | — | ✓ | — | ✓ | — | ✓ | — | ✓ | — | ✓ |
| 512 × 36 | — | ✓ | ✓ | ✓ | ✓ | ✓ | ✓ | ✓ | ✓ | ✓ | ✓ | ✓ | ✓ | ✓ |
| 1k × 18 | — | ✓ | ✓ | ✓ | ✓ | ✓ | ✓ | ✓ | ✓ | ✓ | ✓ | ✓ | ✓ | ✓ |
| 2k × 9 | — | ✓ | ✓ | ✓ | ✓ | ✓ | ✓ | ✓ | ✓ | ✓ | ✓ | ✓ | ✓ | ✓ |
| 4k × 4 | — | ✓ | ✓ | ✓ | ✓ | ✓ | ✓ | ✓ | ✓ | ✓ | ✓ | ✓ | ✓ | ✓ |
| 8k × 2 | — | ✓ | ✓ | ✓ | ✓ | ✓ | ✓ | ✓ | ✓ | ✓ | ✓ | ✓ | ✓ | ✓ |
| 16k × 1 | — | ✓ | ✓ | ✓ | ✓ | ✓ | ✓ | ✓ | ✓ | ✓ | ✓ | ✓ | ✓ | ✓ |

Table 10 is a configuration table of 18 k memory in the SP usage mode, when the address number and the read and write width are different.

TABLE 10

| SP Mode | 256 × 72 | 512 × 36 | 1k × 18 | 2k × 9 | 4k × 4 | 8k × 2 | 16k × 1 |
|---|---|---|---|---|---|---|---|
| EMB 18Kb | ✓ | ✓ | ✓ | ✓ | ✓ | ✓ | ✓ |

It can be seen from table 9 and table 10 that, when the address number and the read and write width of 18K memory are different, the block memory can use different modes, and supports data having bitwidth of 1, 2, 4, 9, 18, 36, 72. Wherein, the maximum read and write width of the SP and SDP usage mode is 72-bit, the maximum read and write width of the TDP usage mode is 32-bit.

When the block memory is 18K, in the SP/TDP mode, the port's data is shown in table 11:

TABLE 11

| Width | dia→doa dib→dob | dipa→dopa dipb→dopb | Depth | addra/ addrb |
|---|---|---|---|---|
| 1 (cascade) | [0] | — | 32K | [14:0] |
| 1 | [0] | — | 16K | [13:0] |

TABLE 11-continued

| Width | dia→doa dib→dob | dipa→dopa dipb→dopb | Depth | addra/ addrb |
|---|---|---|---|---|
| 2 | [1:0] | — | 8K | [13:1] |
| 4 | [3:0] | — | 4K | [13:2] |
| 9 | di[7:0] = dia[7:0] do[7:0] = doa[7:0] | dip[0] = dipa[0] dop[0] = dopa[0] | 2K | [13:3] |
| 18 | di[15:0] = dia[15:0] do[15:0] = doa[15:0] | dip[1:0] = dipa[1:0] dop[1:0] = dopa[1:0] | 1K | [13:4] |
| 36 | di[31:0] = dia[31:0] do[31:0] = doa[31:0] | dip[3:0] = dipa[3:0] dop[3:0] = dop1[3:0] | 512 | [13:5] |
| 72 (SP only) | di[63:0] = dib[63:32], dia[31:0] do[63:0] = dob[63:31], doa[31:0] | dip[7:0] = dipb[7:4], dipa[3:0] dop[7:0] = dopb[7:4], dopa[3:0] | 256 | [13:6] |

When the block memory is 18 k, in the SDP mode, the port's data is shown in table 12:

TABLE 12

| Width | dia/- -/dob | dipa/- -/dopb | Depth | addra/ addrb |
|---|---|---|---|---|
| 1 | [0] | — | 16K | [13:0] |
| 2 | [1:0] | — | 8K | [13:1] |
| 4 | [3:0] | — | 4K | [13:2] |
| 9 | [7:0] | [0] | 2K | [13:3] |
| 18 | di[15:0] = dia[15:0] do[15:0] = dob[15:0] | dip[1:0] = dipa[1:0] dop[1:0] = dopb[1:0] | 1K | [13:4] |
| 36 | di[31:0] = dia[31:0] do[31:0] = dob[31:0] | dip[3:0] = dipa[3:0] dop[3:0] =dopb[3:0] | 512 | [13:5] |
| 72 | di[63:0] = dib[63:32], dia[31:0] do[63:0] = dob[63:31], doa[31:0] | dip[7:0] = dipb[7:4], dipa[3:0] dop[7:0] = dopb[7:4], dopa[3:0] | 256 | [13:6] |

Figure 5:
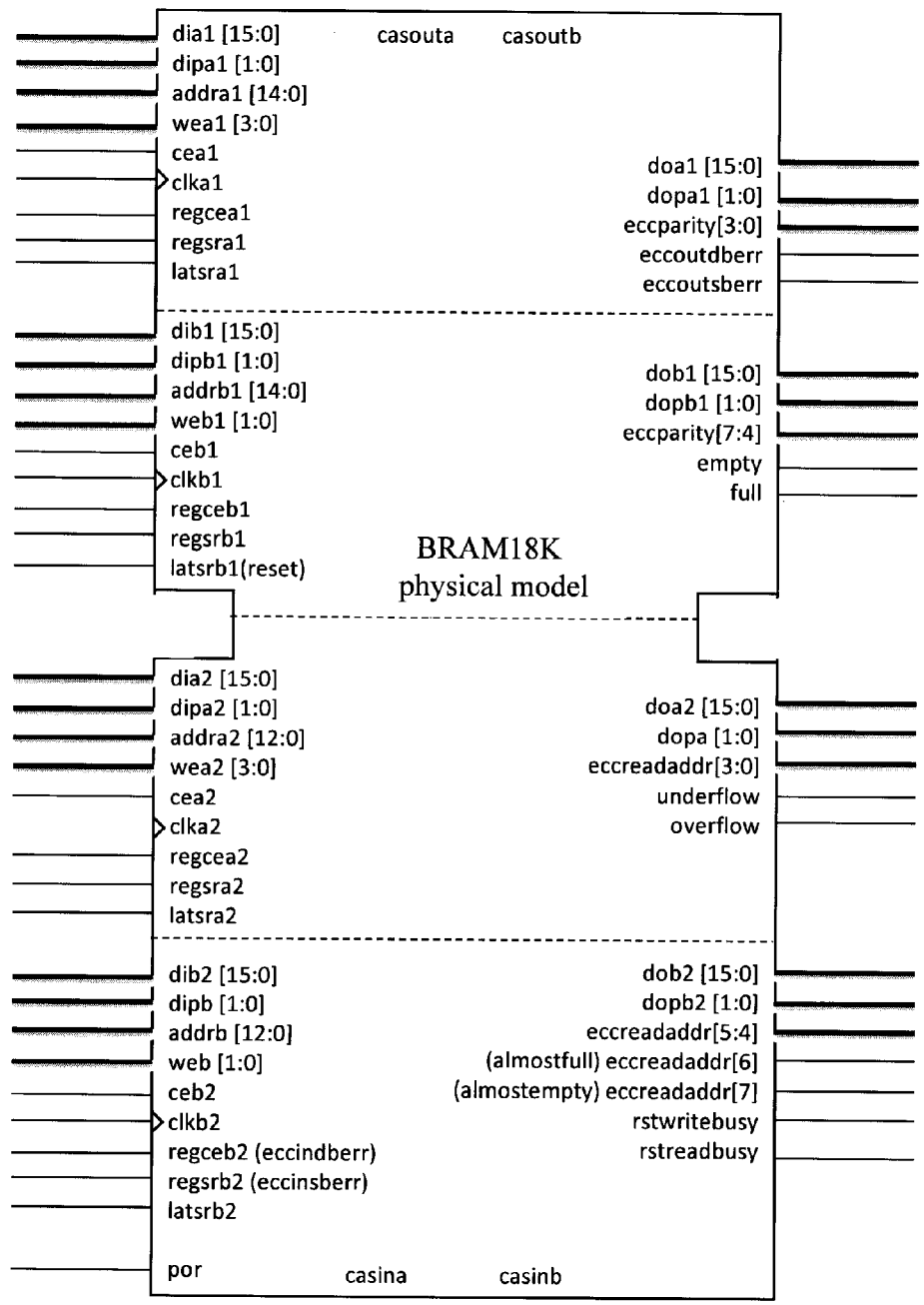
FIG. 5 is a physical model of FIG. 3.

FIG. 5 is a physical model of FIG. 3. In this physical model, the 18 k block memory is made by cascading two blocks of 9 k block memory in FIG. 1. The block memory at the top of the FIG. 3 can be named as the first block memory, the block memory at the bottom of the FIG. 3 can be named as the second block memory.

In the first block memory including a first port and a second port, the first port includes a first clock terminal (clka1), a first clock enable terminal (cea1), a first write enable terminal (wea1[3:0]), a first data input terminal (dia1[15:0]), a first parity-check data input terminal (dipa1[1:0]), a first address line (addra1[14:0]), a first data output terminal (doa1[15:0]), a first parity-check data output terminal (dopa1[1:0]); the second port includes a second clock terminal (clkb1), a second clock enable terminal (ceb1), a second write enable terminal (web1[1:0]), a first data input terminal (dib1[15:0]), a first parity-check data input terminal (dipb1[1:0]), a first address (addrb1[14:0]), a first data output terminal (dob1[15:0]), a first parity-check data output terminal (dopb1[1:0]).

In the second block memory including a first port and a second port, the first port includes a first clock terminal (clka2), a first clock enable terminal (cea2), a first write enable terminal (wea2[3:0]), a first data input terminal (dia2[15:0]), a first parity-check data input terminal (dipa2[1:0]), a first address line (addra2[12:0]), a first data output terminal (doa2[15:0]), a first parity-check data output terminal (dopa2[1:0]); the second port includes a second clock terminal (clkb2), a second clock enable terminal (ceb2), a second write enable terminal (web2[1:0]), a first data input terminal (dib2[15:0]), a first parity-check data input terminal (dipb2[1:0]), a first address (addrb2[12:0]), a first data output terminal (dob2[15:0]), and a first parity-check data output terminal (dopb2[1:0]).

Figure 6A:
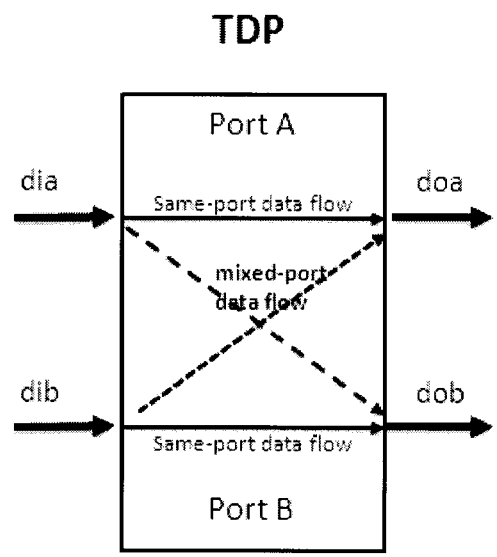
FIG. 6a is a first type of a conflict in FIG. 3.
Figure 6B:
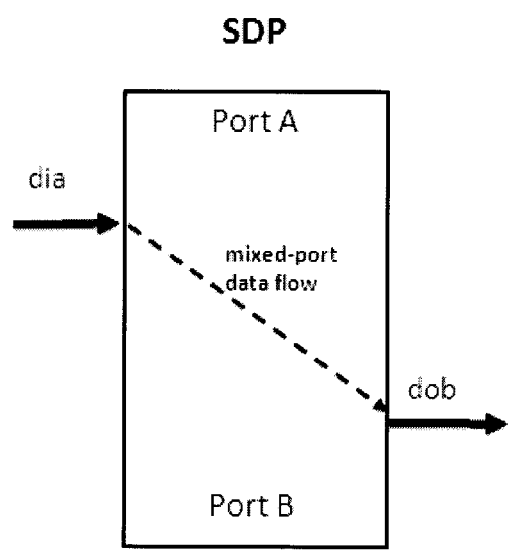
FIG. 6b is a second type of a conflict in FIG. 3.

The block memory in the embodiment of the present invention is a block memory with double ports. In the above TDP and SDP usage mode, when accessing the same address from the two ports at the same time, a read-write conflict will happen. As shown in FIG. 6, the type of the conflict is shown in FIGS. 6a and 6b. When the block memory is in the TDP usage mode, the resulting conflict is shown in FIG. 6a; at this point, if the first data input terminal of the first port writes data to the first address at the time of A, and the first data output terminal of the first port reads the data from the first address at the time of A, at the same time, the second data input terminal of the second port writes data to the first address at the time of A, and the second data output terminal of the second port reads the data from the first address at the time of A, a read-write conflict will happen. When the block memory is in the SDP usage mode, the resulting conflict is shown in FIG. 6b; at this point, if the first data input terminal of the first port writes data to a second address at the time of B, and the second data output terminal of the second port reads the data from the second address at the time of B, a read-write conflict will also happen at this time.

When a read-write conflict happens, the embodiment of the present invention can take the following processing mechanism to extract and design a processing method for different conflicts:

(1) The same port reads and writes one address at the same time.

When the same port reads and writes one address at the same time, this behavior will be controlled by the write mode of a respective port; in the block memory, three kinds of writing modes are included, write_first write mode, read_first write mode, no_change write mode. When the write modes are different, there are the following three kinds of circumstances:

The write_first write mode: a new data is written into the first address of the block memory, and at the same time the new data is read by the read port from the first address.

Specifically, when the first port reads and writes the first address at the same time or the second port reads and writes the first address at the same time, if in the write_first write mode, a new data will be written into the first address of the block memory by the first port, and at the same time the new data of the first address will be read via the first port, or a new data will be written into the first address of the block memory by the second port, and at the same time the new data of the first address will be read by the second port.

The read_first write mode: the original datastored at the first address of the block memory is read by the read port, and a new data will be written into the first address of the block memory.

Specifically, if in the read_first write mode, the original data stored by the first address of the block memory will be read by the first port, and a new data will be written into the first address of the block memory by the first port; or The original datastored by the first address of the block memory will be read by the second port, and a new data will be written into the first address of the block memory by the second port.

The no_change write mode: during a new data is written into the first address, the output of the read port remains unchanged.

Specifically, if in the no_change write mode, a new data will be written into the first address by the first port, and the output of the first port remains unchanged; or a new data will be written into the first address by the second port, and the output of the second port remains unchanged.

(2) The Different Ports Read One Address at the Same Time.

When port 1 and port 2 read the first address at the same time, it can be ensured to read a correct data.

(3) The Different Ports Write One Address at the Same Time.

When port 1 and port 2 writing data into the first address at the same time, the data written into the first address is invalid (written content cannot be guaranteed).

(4) The Different Ports Read and Write One Address at the Same Time.

The read_first write mode: when the write mode of the write port is the read_first write mode, a new data will be written into the first address correctly, and the read port will read the previous datastored by the first address.

Specifically, if in the read_first write mode, a new data will be written into the first address by the first port, and the second port will read the previous datastored by the first address; or a new data will be written into the first address by the second port, and the first port will read the previously stored data by the first address.

The write_first or the no_change write mode: when the write mode of the write port is the read_first or the no_change write mode, a new data will be written into the first address correctly, but the data read by the read port is an invalid data (content cannot be guaranteed).

Specifically, when the write mode of the write port is the read_first or the no_change write mode, a new data will be written into the first address by the first port, the data read by the second port is an invalid data; or a new data will be written into the first address by the second port, the data read by the first port is an invalid data.

Wherein, the read port can be the first data output terminal of the first port, also can be the second data output terminal of the second port; the write port can be the first data input terminal of the first port, also can be the second data input terminal of the second port.

In FIG. 3 and FIG. 4, there still exist: ECC check terminal (eccparity), ECC read address terminal (eccreadaddr), ECC detect double bit error terminal (eccindberr), ECC error detect unit error terminal (eccinsberr). The functions of the terminals are explained below with reference to FIG. 7.

Figure 7:
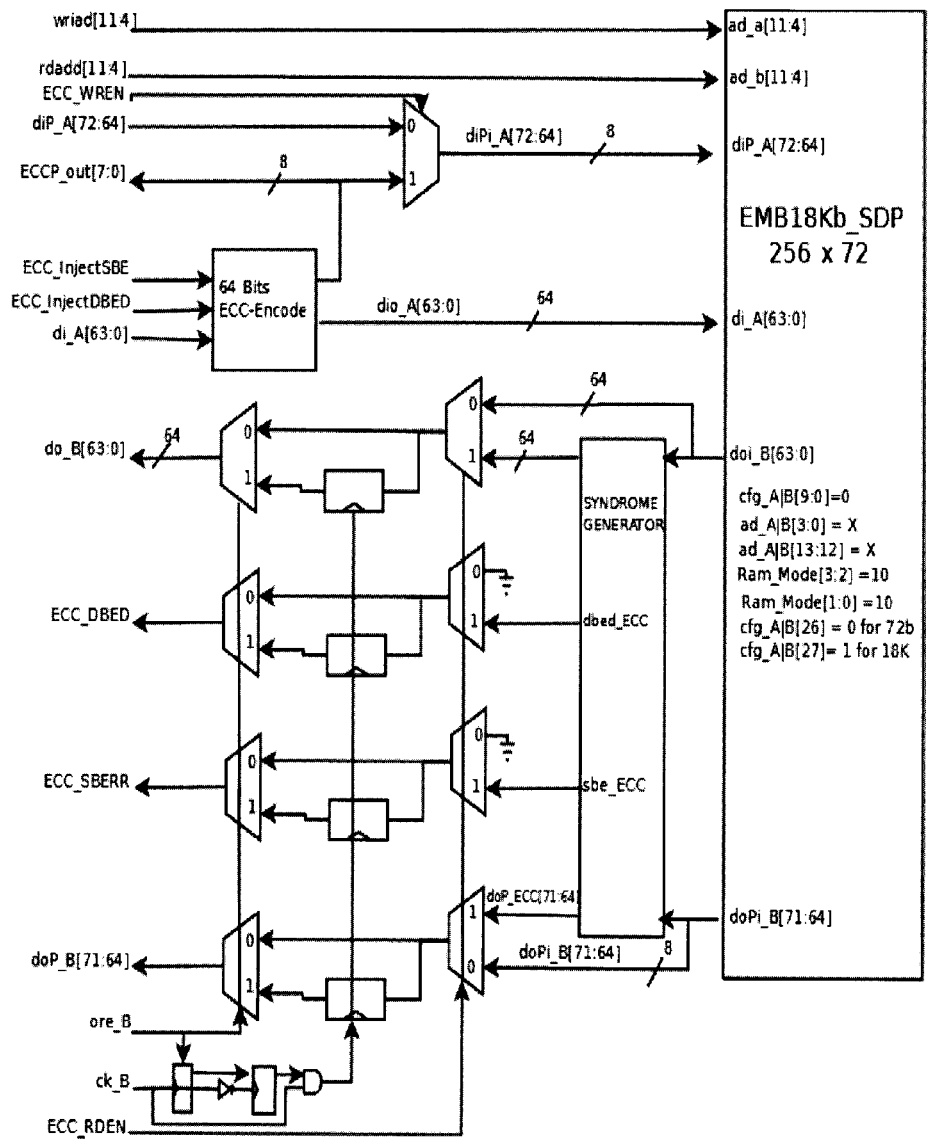
FIG. 7 is a connection circuit diagram of a block memory and an ECC module according to an embodiment of the present invention.

FIG. 7 is a connection circuit diagram of a block memory and an ECC module according to an embodiment of the present invention. As shown in FIG. 7, in this embodiment, the block memory is 18K block memory, and has a SDP usage mode, which may be 256*72 mode, the address number being 256 and the read width and write width being 72-bit. The block memory can support error checking and correcting of Hamming code. Each time writing 64-bit data to the block memory, the encoder of the ECC module will automatically generate 8-bit check bit, and input the 8-bit check bit into the check bit input terminal of the block memory while inputting the data into the data input terminal of the block memory. When reading, a 64-bit data and 8-bit check code will be transmitted to the decoder of ECC module, thereby generating a single bit error (eccoutsberr) and a double bit error (eccoutdberr), and can automatically correct the single bit error.

Wherein, the ECCencoder is opened and closed by a control bit. In FIG. 7, the control bit of the ECCencoder is ECC_WREN. The ECCdecoder may be opened and closed by another control bit; in FIG. 7, the control bit of the ECCencoder is ECC_RDEN.

Figure 8:
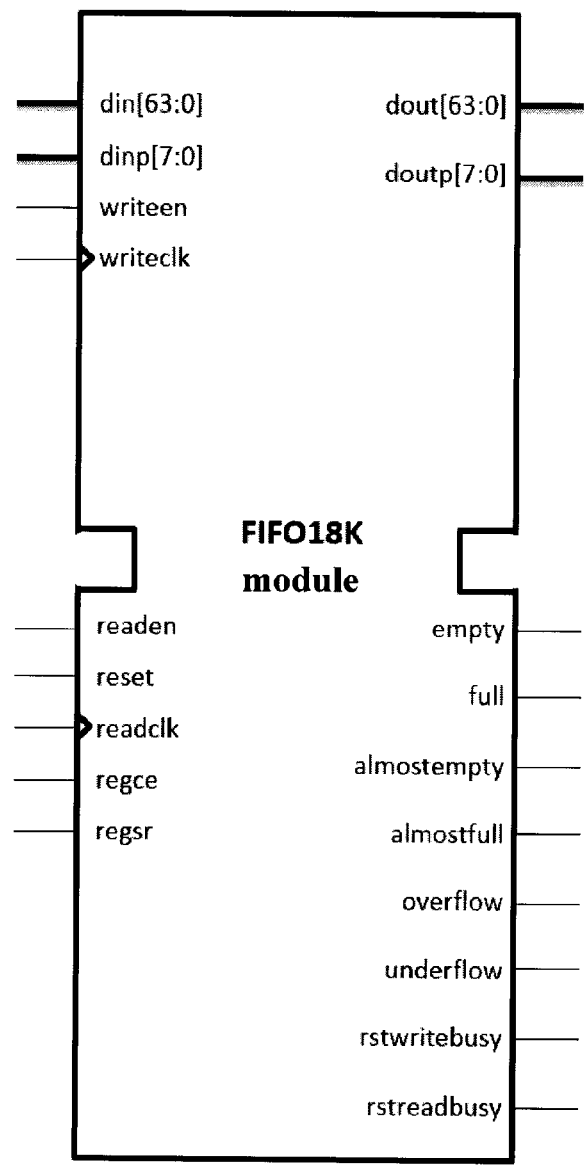
FIG. 8 is a usage mode of FIFO module according to an embodiment of the present invention.

FIG. 8 is a usage mode of FIFO module provided by an embodiment of the present invention.

The description of ports is shown in table 13:

TABLE 13

| port | type | bit-width | description |
|---|---|---|---|
| di[63:0] | Input | 64 | Data input terminal |
| dip[7:0] | Input | 8 | parity-check bit input terminal |
| writeen | Input | 1 | Write enable signal |
| writeclk | Input | 1 | Write clock |
| do[63:0] | Output | 64 | Data output terminal |
| dop[7:0] | Output | 8 | parity-check bit output terminal |
| readclk | Input | 1 | Read clock |
| readen | Input | 1 | Read enable signal |
| regce | Input | 1 | Enable signal of output register. |
| regsr | Input | 1 | Reset signal of output register, its reset value of which is specified by attribute srval_a. |
| reset | Input | 1 | Reset signal |
| empty | Output | 1 | FIFO is an emptyindication signal, and synchronous with the read clock. |
| full | Output | 1 | FIFO is a full indication signal, and asynchronous with the read clock. |
| almostempty | Output | 1 | almost full indication signal of FIFO, is synchronized with the read clock; the data number of the gap between the almost full and the full is specified by the parameteralmostfull. |
| almostfull | Output | 1 | Almostempty indication signal of FIFO, is synchronized with the write clock; the data number of the gap between the almostempty and the empty is specified by the parameter almostemptyth. |
| overflow | Output | 1 | Overflow signal; output when FIFO continuesattempting to write data when the FIFO is full up; synchronous with the write clock. |
| underflow | Output | 1 | Underflow signal; output when FIFO continuesattempting to read data when the FIFO is empty; synchronous with the read clock. |
| rstwritebusy | Output | 1 | output by FIFO when FIFO is in the reset process; synchronous with the write clock. |
| rstreadbusy | Output | 1 | output by FIFO when FIFO is in the reset process; synchronous with the read clock. |

The usage attribute of ports is shown in table 14:

TABLE 14

| attribute | type | Value range | default | description |
|---|---|---|---|---|
| almostemptyth | Hex | 14-bit HEX | 0000h | The data number of the gap between the empty and the almostempty. |
| almostfullth | Hex | 14-bit HEX | 0000h | The data number of the gap between the full and the almostfull. |
| writewidth | Integer | 1, 2, 4, 9, 18, 36, 72 | 1 | The width of write data. |
| readwidth | Integer | 1, 2, 4, 9, 18, 36, 72 | 1 | The width of read data. |
| outreg | Decimal | 0, 1 | 0 | Whether to use output register |
| ensyn | Decimal | 0, 1 | 0 | Whether to set FIFO for synchronization. |
| init | Hex | Any 72-bit value | 000000000000000000h | Specify the initial value for the output register, only used in the synchronousmode. |

TABLE 14-continued

| attribute | type | Value range | default | description |
|---|---|---|---|---|
| srval | Hex | Any 72-bit value | 000000000000000000h | Specify the reset value for output register, only used in the synchronous mode. |
| peek | Decimal | 0, 1 | 0 | Thedata first written into FIFO will be sent to the data output terminal before the readen signal arrivals. |

Figure 9:
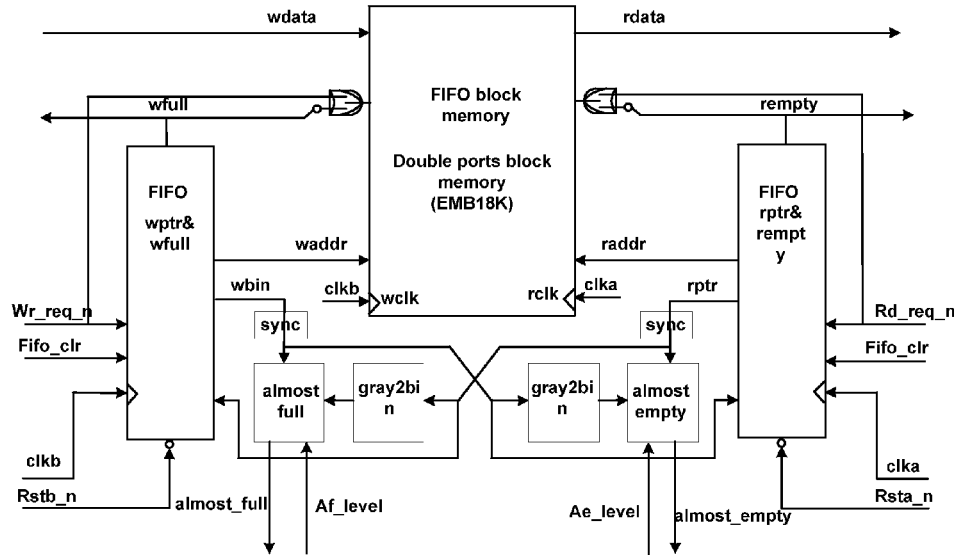
FIG. 9 is a connection circuit diagram of an asynchronous FIFO module and an ECC module according to an embodiment of the present invention.
Figure 10:
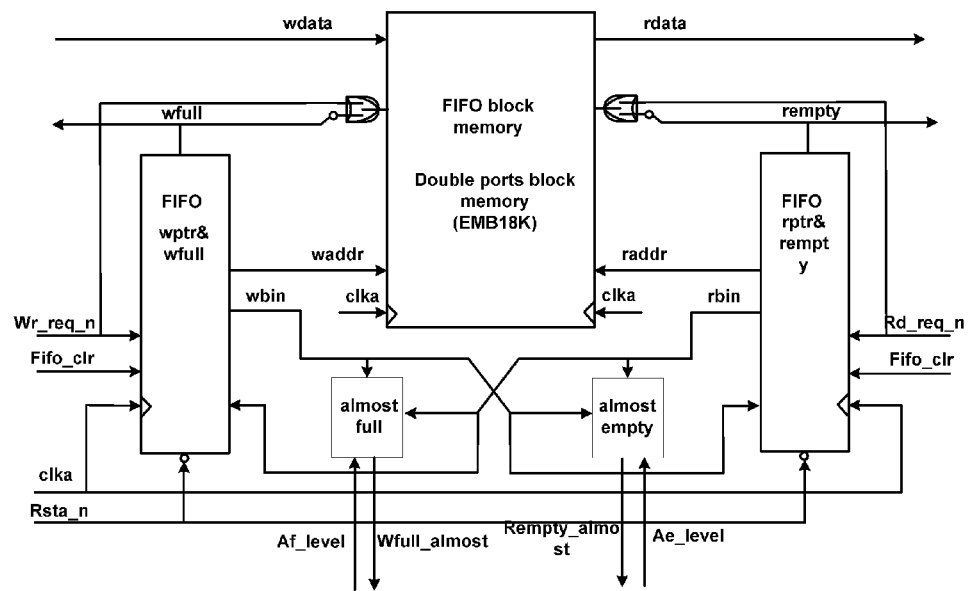
FIG. 10 is a connection circuit diagram of a synchronous FIFO module and an ECC module according to an embodiment of the present invention.

FIG. 9 is a connection circuit diagram of an asynchronous FIFO module and an ECC module according to an embodiment of the present invention; FIG. 10 is a connection circuit diagram of a synchronous FIFO module and an ECC module according to an embodiment of the present invention. As shown in FIG. 9 and FIG. 10, the block memory is an 18K block memory, the read and write clock can be configured as asynchronous or synchronous by the FIFO module; and the block memory includes an overflow output identification, an underflow output identification, an almost full output identification, and an almost empty output identification, wherein the offset between the Almost full output and the overflow output, and the offset between the almost empty output and the underflow output can be configured by parameters of the FIFO module.

FIFO module will output a reset read busy output identification and a reset write busy output identification in the reset process, wherein the reset read busy is synchronous with read clk, the reset write busy is synchronous with write clk, and the FIFO module can't be read and written in the reset process.

Illegal operations of reading and writing, such as reading and/or writing data in the reset process, writing data after overflow, and reading data after underflow, will automatically be refused and the content of FIFO module will not be affected.

The FIFO module includes a standard mode and a first word fall through (FWFT) mode. By using the FIFO module, time sequence of the block memory can be guaranteed.

Figure 11:
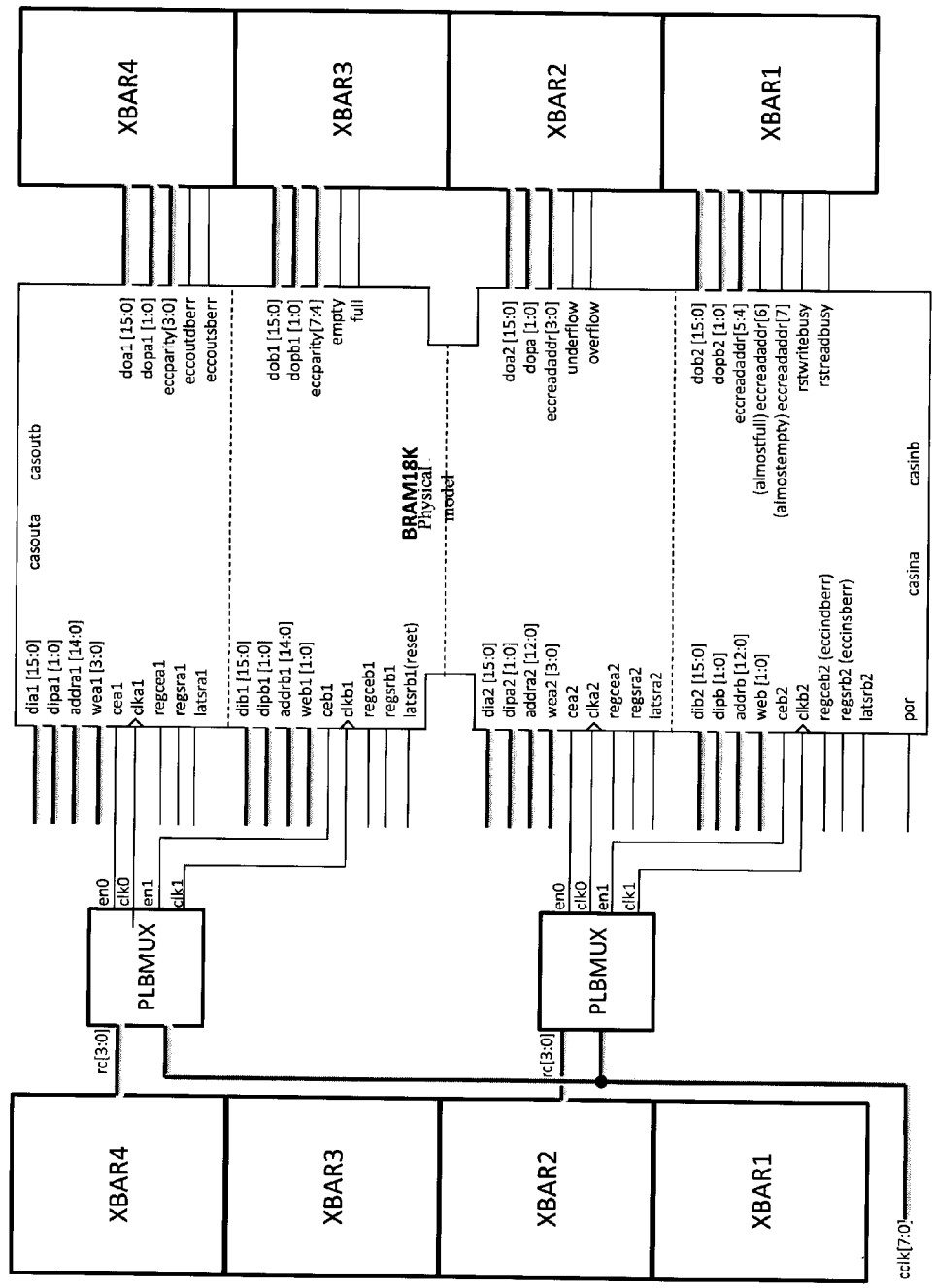
FIG. 11 is a connection diagram of a block memory and an external XBAR according to an embodiment of the present invention.
Figure 12:
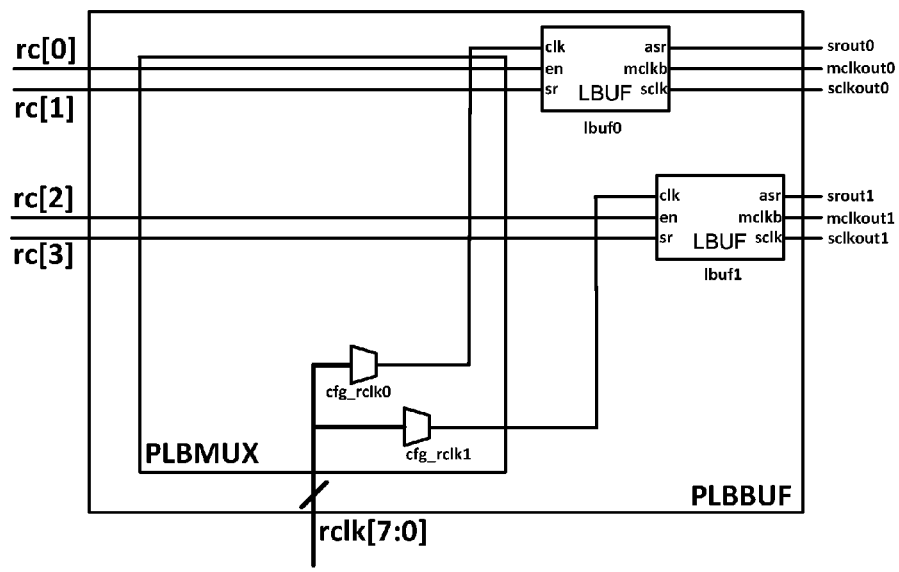
FIG. 12 is an enlarged diagram of PLBMUX in FIG. 11.

FIG. 11 is a connection diagram of a block memory and an external XBAR according to an embodiment of the present invention. As shown in FIG. 11, in this embodiment, the block memory is an 18K block memory, physical model of which can be seen in FIG. 5. In FIG. 11, the first enable terminal (en0) of the first programmable logic block multiplexer (PLBMUX) is connected to the first clock enable terminal (cea1) of the first port of the first block memory, the first clock terminal (clk0) of the first programmable logic block multiplexer (PLBMUX) is connected to the first clock terminal (clka1) of the first port of the first block memory, the second enable terminal (en1) of the first programmable logic block multiplexer (PLBMUX) is connected to the second clock enable terminal (ceb1) of the second port of the first block memory, the second clock terminal (clk1) of the first programmable logic block multiplexer (PLBMUX) is connected to the second clock terminal (clkb1) of the second port of the first block memory; the first enable terminal (en0) of the second programmable logic block multiplexer (PLBMUX) is connected to the first clock enable terminal (cea1) of the first port of the second block memory, the first clock terminal (clk0) of the second programmable logic block multiplexer (PLBMUX) is connected to the first clock terminal (clka1) of the first port of the second block memory, the second enable terminal (en1) of the second programmable logic block multiplexer (PLBMUX) is connected to the second clock enable terminal (ceb1) of the second port of the second block memory, the second clock terminal (clk1) of the second programmable logic block multiplexer (PLBMUX) is connected to the second clock terminal (clkb1) of the second port of the second block memory. The block memory in the embodiment of the present invention can be configured in the FPGA chip by the connection shown in FIG. 10. FIG. 12 is an enlarged diagram of PLBMUX in FIG. 11. The description of ports in FIG. 11 and FIG. 12 is shown in table 15:

TABLE 15

| port | Type | bit-wide | description |
|---|---|---|---|
| dia1[15:0] | Input | 16 | The first data input terminal of port A |
| dipa1[1:0] | Input | 2 | The first parity-check bit data input terminal of port A |
| addra1[14:0] | Input | 15 | The first address input terminal of port A. |
| wea1[3:0] | Input | 4 | The first bit-wise write enable input terminal of port A. |
| cea1 | Input | 1 | The first clock enable terminal of port A. |
| clka1 | Input | 1 | The first clock of port A. |
| regcea1 | Input | 1 | The enable signal terminal of the first output register of port A. |
| regsra1 | Input | 1 | The reset signal terminal of the first output register of port A. |
| latsra1 | Input | 1 | The reset signal terminal of the first output latch of port A. |
| dib1[15:0] | Input | 16 | The first data input terminal of port B. |
| dipb1[1:0] | Input | 2 | The first parity-check bit data input terminal of port B. |
| addrb1[14:0] | Input | 15 | The first address input terminal of port B. |
| web1[1:0] | Input | 2 | The first bit-wise write enable input terminal of port B. |
| ceb1 | Input | 1 | The first clock enable terminal of port B. |
| clkb1 | Input | 1 | The first clock of port B. |
| regceb1 | Input | 1 | The enable signal terminal of the first output register of port B. |
| regsrb1 | Input | 1 | The reset signal terminal of the first output register of port B. |

TABLE 15-continued

| port | Type | bit-wide | description |
| --- | --- | --- | --- |
| latsrb1 | Input | 1 | The reset signal terminal of the first output latch of port B. |
| dia2[15:0] | Input | 16 | The second data input terminal of port A |
| dipa2[1:0] | Input | 2 | The second parity-check bit data input terminal of port A |
| addra2[12:0] | Input | 13 | The second address input terminal of port A. |
| wea2[3:0] | Input | 4 | The secondbit-wise write enable input terminal of port A. |
| cea2 | Input | 1 | The second clock enable terminal of port A. |
| clka2 | Input | 1 | The second clock of port A. |
| regcea2 | Input | 1 | The enable signal terminal of the second output register of port A. |
| regsra2 | Input | 1 | The reset signal terminal of the second output register of port A. |
| latsra2 | Input | 1 | The reset signal terminal of the second output latch of port A. |
| dib2[15:0] | Input | 16 | Thesecond data input terminal of port B. |
| dipb2[1:0] | Input | 2 | The secondparity-check bit data input terminal of port B. |
| addrb2[12:0] | Input | 13 | The second address input terminal of port B. |
| web2[1:0] | Input | 2 | The secondbit-wise write enable input terminal of port B. |
| ceb2 | Input | 1 | The second clock enable terminal of port B. |
| clkb2 | Input | 1 | The second clock of port B. |
| regceb2 (eccindberr) | Input | 1 | The enable signal terminal of the second output register of port B(ECC double bit error input terminal). |
| regsrb2 (eccinsberr) | Input | 1 | The reset signal terminal of the second output register of port B(ECC single bit error input terminal). |
| latsrb2 | Input | 1 | The reset signal terminal of the second output latch of port B. |
| por | Input | 1 | The global reset signal input terminal. |
| casina | Input | 1 | The cascade signal input terminal of Port A. |
| casinb | Input | 1 | The cascade signal input terminal of Port B. |
| casouta | Output | 1 | The cascade signal output terminal of Port A. |
| casoutb | Output | 1 | The cascade signal output terminal of Port B. |
| doa1[15:0] | Output | 16 | The first data output terminal of port A. |
| dopa1[1:0] | Output | 2 | The firstparity-check bit data output terminal of port A. |
| eccparity | Output | 8 | The output of check code generated by ECC encoder. |
| eccoutdberr | Output | 1 | The output of ECC double bit error signal |
| eccoutsberr | Output | 1 | The output of ECC single bit error signal |
| dob1[15:0] | Output | 16 | The first data output terminal of port B |
| dopb1[1:0] | Output | 2 | The first parity-check bit data output terminal of port B. |
| empty | Output | 1 | FIFO empty indication signal. |
| full | Output | 1 | FIFO full indication signal. |
| doa2[15:0] | Output | 16 | The second data output terminal of port A. |
| dopa2[1:0] | Output | 2 | The secondparity-check bit data output terminal of port A. |
| eccreadaddr[5:0] | Output | 4 | The read address of ECC (low 6 bit). |
| underflow | Output | 1 | The underflow signal of FIFO. |
| overflow | Output | 1 | The overflowsignalof FIFO. |
| dob2[15:0] | Output | 16 | The second data output terminal of port B. |
| dopb2[1:0] | Output | 2 | The secondparity-check bit data output terminal of port B. |
| eccreadaddr[6] (almostfull) | Output | 1 | The read address of ECC (the7th bit). Almostfull indication signal of FIFO. |
| eccreadaddr[7] (almostempty) | Output | 1 | The read address of ECC (the 8th bit) Almostempty indication signal of FIFO. |
| rstwritebusy | Output | 1 | The signal output by FIFO when FIFO is in the reset process, and synchronous with the write clock. |
| rstreadbusy | Output | 1 | The signal output by FIFO when FIFO is in the reset process, and synchronous with the read clock. |

The block memory provided by the embodiment of the present invention, and port mapping in FIG. 11 and FIG. 12 is shown in table 16:

TABLE 16

| | | | \multicolumn{2}{c}{Inputs = 164} | | |
|---|---|---|---|---|---|---|
| Column1 | Port | BRAM18K | EMB9K Bank1 | EMB9K Bank2 | EMB18K | FIFO18K |
| | | | Port A | | Port A LSB | |
| c1r4 | f5[7:0] | dia1[15:8] | dia[15:8] | | dia[15:8] | din[15:8] |
| | f4[7:0] | dia1[7:0] | dia[7:0] | | dia[7:0] | din[7:0] |
| | f3[1:0] | dipa1[1:0] | dipa[1:0] | | dipa[1:0] | dinp[1:0] |
| | f2[7:6] | addra1[14:13] | | | addra[14:13] | |
| | f2[5:0] | addra1[12:7] | addra[12:7] | | addra[12:7] | |
| | f1[7:1] | addra1[6:0] | addra[6:0] | | addra[6:0] | |
| | f0[3:0] | wea1[3:0] | wea[3:0] | | wea[3:0] | |
| | PLBMUX: en0 | cea1 | cea | | cea | writeen |
| | PLBMUX: clk0 | clka1 | clka | | clka | writeclk |
| | f0[4] | regcea1 | regcea | | regcea | |
| | f0[5] | regsra1 | regsra | | regsra | |
| | f0[6] | latsra1 | latsra | | latsra | |
| | | | Port B | | Port B LSB | |
| c1r3 | f5[7:0] | dib1[15:8] | dib[15:8] | | dib[15:8] | din[31:24] |
| | f4[7:0] | dib1[7:0] | dib[7:0] | | dib[7:0] | din[23:16] |
| | f3[1:0] | dipb1[1:0] | dipb[1:0] | | dipb[1:0] | dinp[3:2] |
| | f2[7:6] | addrb1[14:13] | addrb[7:0] | | addrb[14:13] | |
| | f2[5:0] | addrb1[12:7] | addrb[12:7] | | addrb[12:7] | |
| | f1[7:1] | addrb1[6:0] | addrb[6:0] | | addrb[6:0] | |
| | f0[1:0] | web1[1:0] | web[1:0] | | web[1:0] | |
| | PLBMUX: en1 | ceb1 | ceb | | ceb | readen |
| | PLBMUX: clk1 | clkb1 | clkb | | clkb | readclk |
| | f0[4] | regceb1 | regceb | | regceb | regce |
| | f0[5] | regsrb1 | regsrb | | regsrb | regsr |
| | f0[6] | latsrb1 reset | latsrb | | latsrb | reset |
| | f5[7:0] | dib1[15:8] | dib[15:8] | | dib[15:8] | din[31:24] |
| | | | | Port A | Port A MSB | |
| c1r2 | f5[7:0] | dia2[15:8] | | dia[15:8] | dia[31:24] | din[47:40] |
| | f4[7:0] | dia2[7:0] | | dia[7:0] | dia[23:16] | din[39:32] |
| | f3[1:0] | dipa2[1:0] | | dipa[1:0] | dipa[3:2] | dinp[5:4] |
| | f2[5:0] | addra2[12:7] | | addra[12:7] | | |
| | f1[7:1] | addra2[6:0] | | addra[6:0] | | |
| | f0[3:0] | wea2[3:0] | | wea[3:0] | wea[7:4] | |
| | PLBMUX: en0 | cea2 | | cea | | |
| | PLBMUX: clk0 | clka2 | | clka | | |
| | f0[4] | regcea2 | | regcea | | |
| | f0[5] | regsra2 | | regsra | | |
| | f0[6] | latsra2 | | latsra | | |
| | | | | Port B | Port B MSB | |
| c1r1 | f5[7:0] | dib2[15:8] | | dib[15:8] | dib[31:24] | din[63:56] |
| | f4[7:0] | dib2[7:0] | | dib[7:0] | dib[23:16] | din[55:48] |
| | f3[1:0] | dipb2[1:0] | | dipb[1:0] | dipb[3:2] | dinp[7:6] |
| | f2[5:0] | addrb2[12:7] | | addrb[12:7] | | |
| | f1[6:1] | addrb2[6:0] | | addrb[6:0] | | |
| | f0[1:0] | web2[1:0] | | web[1:0] | web[3:2] | |
| | PLBMUX: en1 | ceb2 | | ceb | | |
| | PLBMUX: clk1 | clkb2 | | clkb | | |
| | f0[4] | regceb2 | | regceb | eccindberr | |
| | f0[5] | regsrb2 | | regsrb | eccinsberr | |
| | f0[6] | latsrb2 | | latsrb | | |

With the application of a configuration structure of the block memory according to an embodiment of the present invention, the read width and the write width of the block memory can be independently configured; and since the block memory has a built-in ECC function and an FIFO function, the block memories can be cascaded to be a block memory with larger storage space, without consuming additional logic resources.

Persons skilled in the art may further realize that, in combination with the embodiments herein, units and algorithm, steps of each example described can be implemented with electronic hardware, computer software, or the combination thereof. In order to clearly describe the interchangeability between the hardware and the software, compositions and steps of each example have been generally described according to functions in the foregoing descriptions. Whether the functions are executed in a mode of hardware or software depends on particular applications and design constraint conditions of the technical solutions. Persons skilled in the art can use different methods to implement the described functions for each particular application, but it should not be considered that the implementation goes beyond the scope of the embodiments of the present invention.

In combination with the embodiments herein, steps of the method or algorithm described may be directly implemented using hardware, a software module executed by a processor, or the combination thereof. The software module may be placed in a random access memory (RAM), a memory, a read-only memory (ROM), an electrically programmable ROM (EPROM), an electrically erasable programmable ROM (EEPROM), a register, a hard disk, a removable magnetic disk, a CD-ROM, or any storage medium of other forms well-known in the technical field.

The objectives, technical solutions, and beneficial effects of the present invention have been described in further detail through the above specific embodiments. It should be understood that the above descriptions are merely specific embodiments of the present invention, but not intended to limit the present invention. Any modification, equivalent replacement, or improvement made without departing from the spirit and principle of the present invention should fall within the scope of the present invention.

What is claimed is:

1. A configuration structure of a block memory, wherein the configuration structure comprises: a first port, a second port, an Error Checking and Correcting (ECC) module, and a First Input First Output (FIFO) module;
   wherein the first port includes a first clock terminal, a first clock enable terminal, a first write enable terminal, a first data input terminal, and a first address input terminal, wherein the read width and the write width of the first port have different values, and the read width of the first port is equal to the write width of the first port multiplied by the Nth power of two; wherein when the number of the read address of the first port is different from that of the write address of the first port, the number of address lines of the first address input terminal meets the bigger one of the number of read address of the first port and the number of write address of the first port,
   wherein the second port includes a second clock terminal, a second clock enable terminal, a second write enable terminal, a second data input terminal, and a second address input terminal, wherein the read width and the write width of the second port have different values, and the read width of the second port is equal to the write width of the second port multiplied by the Nth power of two, wherein when the number of the read address of the second port is different from that of the write address of the second port, the number of address lines of the second address input terminal meets the bigger one of the number of read address of the second port and the number of write address of the second port, wherein N is an integer,
   wherein the read width of the first port and the read width of the second port have different values, and the write width of the first port and the write width of the second port have different values,
   wherein when a first data is written into the first data input terminal, according to the bits of the first data, the control signal of the first write enable terminal controls the first data to be written into the block memory bit-wisely;
   wherein when a second data is written into the second data input terminal, according to the bits of the second data, the control signal of the second write enable terminal controls the second data to be written into the block memory bit-wisely;
   wherein the ECC module includes an ECC encoder and an ECC decoder, when the first data is written into the first data input terminal, the ECC encoder generates a check bit for the first data, which check bit is written into the block register via a first parity data input terminal of the first port, wherein when reading the first data, the ECC decoder gets the first data and the check bit from the block memory, and generates a single bit error and a double bit error; and
   wherein the FIFO module is used for setting the first clock enable terminal and the second clock enable terminal, so as to make the read clock of the block memory synchronous or asynchronous with and the write clock of the block memory.

2. The configuration structure of a block memory according to claim 1, wherein
   the ECC encoder includes an encoder control bit for opening or closing the ECC encoder; and
   the ECC decoder includes a decoder control bit for opening or closing the ECC decoder.

3. The configuration structure of a block memory according to claim 1, wherein the block memory is a block of 18K block memory and is configured to be cascaded with a second block of 18K block memory as a block of 32kx1 block memory.

4. The configuration structure of a block memory according to claim 1, wherein the block memory includes a Single Port (SP) usage mode, a Simple Dual Port (SDP) usage mode, and a True Dual Port (TDP) usage mode.

5. The configuration structure of a block memory according to claim 4, wherein when the block memory has a size of 18K, the maximum data width of the SP usage mode is 72 bit, and the maximum data width of the SDP usage mode is 72 bit, and the maximum data width of the TDP usage mode is 36 bit.

6. The configuration structure of a block memory according to claim 1, wherein the block memory includes a write_first write mode, a read_first write mode, and a no_change write mode.

7. The configuration structure of a block memory according to claim 6, wherein when the first port reads and writes the first address at the same time, or the second port reads and writes the first address at the same time,
   if in the write_first write mode, a new data will be written into the first address of the block memory by the first port, and at the same time the new data of the first address will be read by the first port, or a new data will be written into the first address of the block memory by the second port, and at the same time the new data of the first address will be read by the second port;

if in the read_first write mode, an original data stored by the first address of the block memory will be read by the first port, and a new data will be written into the first address of the block memory by the first port, an original data stored by the first address of the block memory will be read by the second port, and a new data will be written into the first address of the block memory by the second port; and if in the no_change write mode, a new data will be written into the first address by the first port, and the output of the first port remains unchanged, or a new data will be written into the first address by the second port, and the output of the second port remains unchanged.

8. The configuration structure of a block memory according to claim 6, wherein when the first port reads the first address and the second port writes the first address, or when the first port writes the first address and the second port reads the first address, if in the read_first write mode, a new data will be written into the first address by the first port, and a previous data stored by the first address will be read by the second port, or a new data will be written into the first address by the second port, and a previous data stored by the first address will be read by the first port; and if in the write_first write mode or the no_change write mode, a new data will be written into the first address by the first port, and a read data of the second port will be an invalid data, or a new data will be written into the first address by the second port, and a read data of the first port will be an invalid data.

9. The configuration structure of a block memory according to claim 1, wherein the FIFO module includes an overflow output identification, an underflow output identification, an almost empty output identification, and an almost full output identification, wherein the offset between the almost full output and the Overflow output, and the offset between the almost empty output and the undefllow output are configured by parameters of the FIFO module.

10. A configuration method of a block memory, comprising:

the read width and the write width of the first port have different values, and the read width of the first port is equal to the write width of the first port multiplied by the Nth power of two, when the number of the read address of the first port is different from that of the write address of the first port, the number of address lines of the first address input terminal meets the bigger one of the number of read address of the first port and the number of write address of the first port;

the read width and the write width of the second port have different values, and the read width of the second port is equal to the write width of the second port multiplied by the Nth power of two, when the number of the read address of the second port is different from that of the write address of the second port, the number of address lines of the second address input terminal meets the bigger one of the number of read address of the second port and the number of write address of the second port, wherein N is an integer;

the read width of the first port and the read width of the second port have different values, and the write width of the first port and the write width of the second port have different values;

when a first data is written into the first data input terminal, according to the bits of the first data, the control signal of the first write enable terminal controls the first data to be written into the block memory bit-wisely;

when a second data is written into the second data input terminal, according to the bits of the second data, the control signal of the second write enable terminal controls the second data to be written into the block memory bit-wisely;

an Error Checking and Correcting (ECC) module includes an ECC encoder and an ECC decoder, when the first data is written into the first data input terminal, the ECC encoder generates a check bit of the first data, and the check bit is written into the block register by a first parity data input terminal of the first port; when reading the first data, the ECC decoder gets the first data and the check bit from the block memory, and generates a single bit error and a double bit error; and a First Input First Output (FIFO) module sets the first clock enable terminal and the second clock enable terminal, so as to make the read clock of the block memory synchronous or asynchronous with the write clock of the block memory.

11. The method of a block memory according to claim 10, wherein the ECC encoder includes an encoder control bit, and a decoder control bit, wherein the method further comprises:

the encoder control bit opens or closes the ECC encoder; and the decoder control bit opens or closes the ECC decoder.

12. The method of a block memory according to claim 10, wherein the method comprises: when the block memory has a size of 18K, the maximum data width of the a Single Port (SP) usage mode is 72 bit, and the maximum data width of the a Simple Dual Port (SDP) usage mode is 72 bit, and the maximum data width of the True Dual Port (TDP) usage mode is 36 bit.

13. The method of a block memory according to claim 10, wherein the block memory includes a write_first write mode, a read_first write mode, and a no_change write mode.

14. The method of a block memory according to claim 13, wherein when the first port reads and writes the first address at the same time, the second port reads and writes the first address at the same time, if in the write_first write mode, a new data will be written into the first address of the block memory by the first port, and at the same time the new data of the first address will be read by the first port, or a new data will be written into the first address of the block memory by the second port, and at the same time the new data of the first address will be read by the second port;

if in the read_first write mode, an original data stored by the first address of the block memory will be read by the first port, and a new data will be written into the first address of the block memory by the first port, or an original data stored by the first address of the block memory will be read by the second port, and a new data will be written into the first address of the block memory by the second port; and if in the no_change write mode, a new data will be written into the first address by the first port, and the output of the first port remains unchanged, or a new data will be written into the first address by the second port, and the output of the second port remains unchanged.

15. The method of a block memory according to claim 13, wherein when the first port reads the first address and the second port writes the first address, or when the first port writes the first address and the second port reads the first address, if in the read_first write mode, a new data will be written into the first address by the first port, and a previous data stored by the first address will be read by the second port, or a new data will be written into the first address by the second port, and a previous data stored by the first address will be read by the first port, and if in the write_first write mode or the no_change write mode, a new data will be written into the first address by the first port, and a read data of the second port will be an invalid data, or a new data will be written into the first address by the second port, and a read data of the first port will be an invalid data.

16. The method of a block memory according to claim 10, wherein the FIFO module includes an overflow output identification, an underflow output identification, an almost empty output identification, an almost full output identification, wherein the offset between the almost full output and the overflow output, and the offset between the almost empty output and the underflow output are configured by parameters of the FIFO module.

\* \* \* \* \*